(12) United States Patent
Lin et al.

(10) Patent No.: US 9,087,930 B2
(45) Date of Patent: Jul. 21, 2015

(54) SEMICONDUCTOR DEVICE AND METHOD OF FORMING INSULATING LAYER DISPOSED OVER THE SEMICONDUCTOR DIE FOR STRESS RELIEF

(71) Applicant: STATS ChipPAC, Ltd., Singapore (SG)

(72) Inventors: Yaojian Lin, Singapore (SG); Pandi C. Marimuthu, Singapore (SG); Kang Chen, Singapore (SG); Hin Hwa Goh, Singapore (SG); Yu Gu, Singapore (SG); Il Kwon Shim, Singapore (SG); Rui Huang, Singapore (SG); Seng Guan Chow, Singapore (SG); Jianmin Fang, Singapore (SG); Xia Feng, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 14/274,599

(22) Filed: May 9, 2014

(65) Prior Publication Data
US 2014/0246779 A1   Sep. 4, 2014

Related U.S. Application Data

(60) Continuation of application No. 13/782,618, filed on Mar. 1, 2013, now Pat. No. 8,759,155, which is a (Continued)

(51) Int. Cl.
*H01L 23/00* (2006.01)
*H01L 21/56* (2006.01)
(Continued)

(52) U.S. Cl.
CPC ............. *H01L 24/94* (2013.01); *H01L 21/568* (2013.01); *H01L 21/76877* (2013.01);
(Continued)

(58) Field of Classification Search
CPC .............. H01L 2224/73265; H01L 2224/97; H01L 2924/0665; H01L 2224/2919; H01L 21/563
USPC .......................................... 257/773; 438/618
See application file for complete search history.

(56) References Cited

U.S. PATENT DOCUMENTS

| 5,309,026 A | 5/1994 | Matsumoto |
| 5,614,765 A | 3/1997 | Avanzino et al. |

(Continued)

FOREIGN PATENT DOCUMENTS

JP         2004128286 A      4/2004

*Primary Examiner* — Roy Potter
(74) *Attorney, Agent, or Firm* — Robert D. Atkins; Patent Law Group: Atkins and Associates, P.C.

(57) ABSTRACT

A semiconductor device has a semiconductor die and conductive layer formed over a surface of the semiconductor die. A first channel can be formed in the semiconductor die. An encapsulant is deposited over the semiconductor die. A second channel can be formed in the encapsulant. A first insulating layer is formed over the semiconductor die and first conductive layer and into the first channel. The first insulating layer extends into the second channel. The first insulating layer has characteristics of tensile strength greater than 150 MPa, elongation between 35-150%, and thickness of 2-30 micrometers. A second insulating layer can be formed over the semiconductor die prior to forming the first insulating layer. An interconnect structure is formed over the semiconductor die and encapsulant. The interconnect structure is electrically connected to the first conductive layer. The first insulating layer provides stress relief during formation of the interconnect structure.

25 Claims, 28 Drawing Sheets

Related U.S. Application Data continuation of application No. 13/333,739, filed on Dec. 21, 2011, now Pat. No. 8,456,002, and a continuation-in-part of application No. 12/724,367, filed on Mar. 15, 2010, now Pat. No. 8,343,809, and a continuation-in-part of application No. 13/207,633, filed on Aug. 11, 2011, which is a continuation of application No. 12/822,080, filed on Jun. 23, 2010, now Pat. No. 8,004,095, which is a division of application No. 11/957,101, filed on Dec. 14, 2007, now Pat. No. 7,767,496, said application No. 13/333,739 is a continuation-in-part of application No. 13/029,936, filed on Feb. 17, 2011, now Pat. No. 8,183,095.

(60) Provisional application No. 61/435,223, filed on Jan. 21, 2011, provisional application No. 61/443,157, filed on Feb. 15, 2011, provisional application No. 61/313,208, filed on Mar. 12, 2010.

(51) Int. Cl.

| | | |
|---|---|---|
| *H01L 23/31* | (2006.01) | |
| *H01L 23/498* | (2006.01) | |
| *H01L 23/538* | (2006.01) | |
| *H01L 21/768* | (2006.01) | |
| *H01L 23/528* | (2006.01) | |
| *H01L 23/522* | (2006.01) | |

(52) U.S. Cl.
CPC ..... *H01L 23/3128* (2013.01); *H01L 23/49816* (2013.01); *H01L 23/522* (2013.01); *H01L 23/528* (2013.01); *H01L 23/5389* (2013.01); *H01L 24/19* (2013.01); *H01L 24/20* (2013.01); *H01L 24/96* (2013.01); *H01L 23/3135* (2013.01); *H01L 2224/12105* (2013.01); *H01L 2224/48091* (2013.01); *H01L 2224/96* (2013.01); *H01L 2924/01004* (2013.01); *H01L 2924/014* (2013.01); *H01L 2924/01006* (2013.01); *H01L 2924/01013* (2013.01); *H01L 2924/01019* (2013.01); *H01L 2924/01029* (2013.01); *H01L 2924/01043* (2013.01); *H01L 2924/01047* (2013.01); *H01L 2924/01049* (2013.01); *H01L 2924/01073* (2013.01); *H01L 2924/01078* (2013.01); *H01L 2924/01079* (2013.01); *H01L 2924/01082* (2013.01); *H01L 2924/01322* (2013.01); *H01L 2924/10156* (2013.01); *H01L 2924/10157* (2013.01); *H01L 2924/12041* (2013.01); *H01L 2924/1306* (2013.01); *H01L 2924/13091* (2013.01)

(56) References Cited

U.S. PATENT DOCUMENTS

| | | | |
|---|---|---|---|
| 5,834,340 A * | 11/1998 | Sawai et al. | 438/126 |
| 6,274,486 B1 | 8/2001 | Rhodes et al. | |
| 7,348,277 B2 | 3/2008 | Koo et al. | |
| 8,193,647 B2 * | 6/2012 | Hsieh et al. | 257/797 |
| 2004/0219717 A1 | 11/2004 | Takahashi et al. | |
| 2008/0136004 A1 | 6/2008 | Yang et al. | |
| 2008/0315385 A1 | 12/2008 | Gerber et al. | |

* cited by examiner

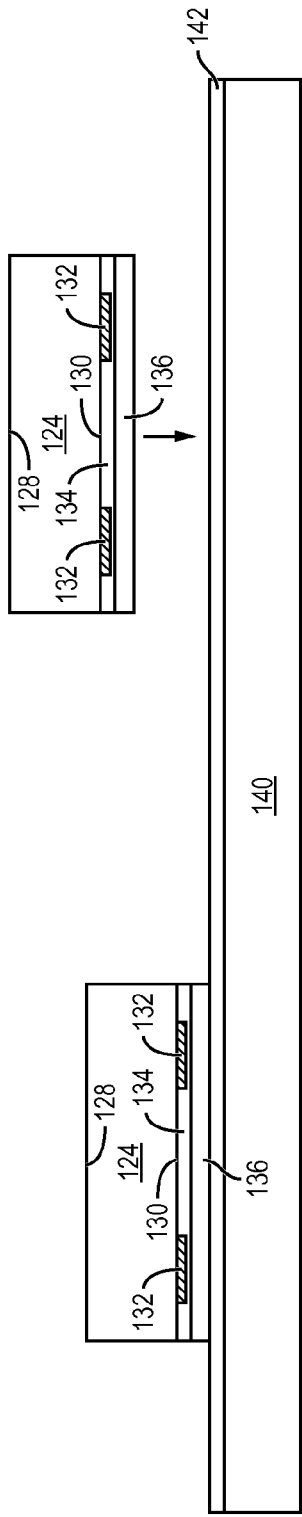
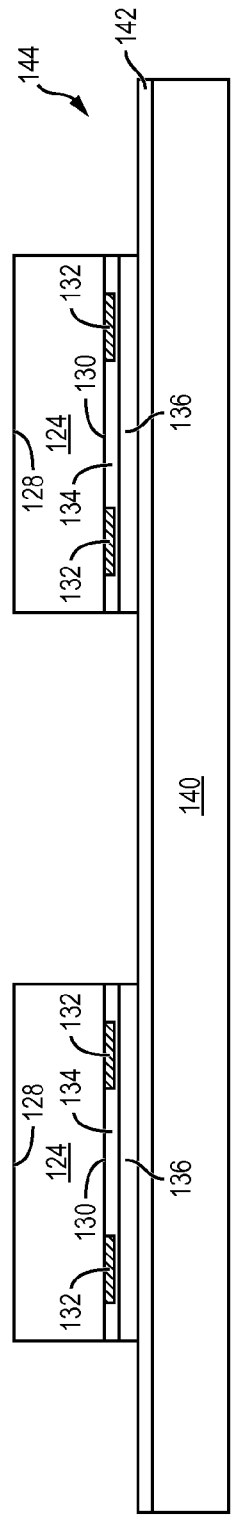
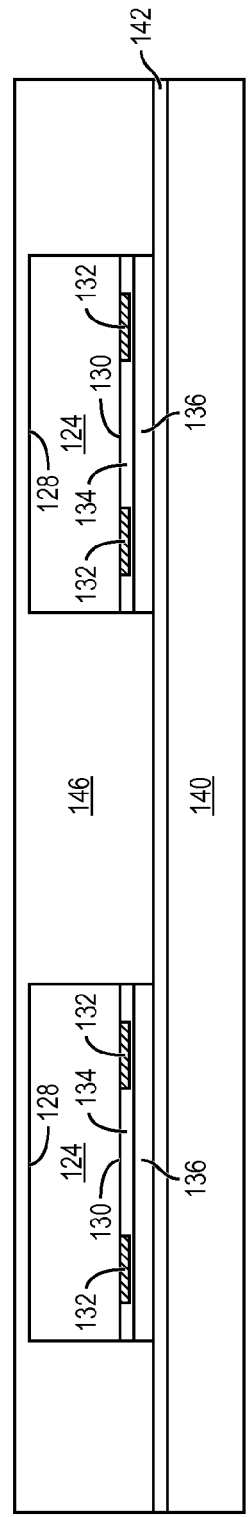

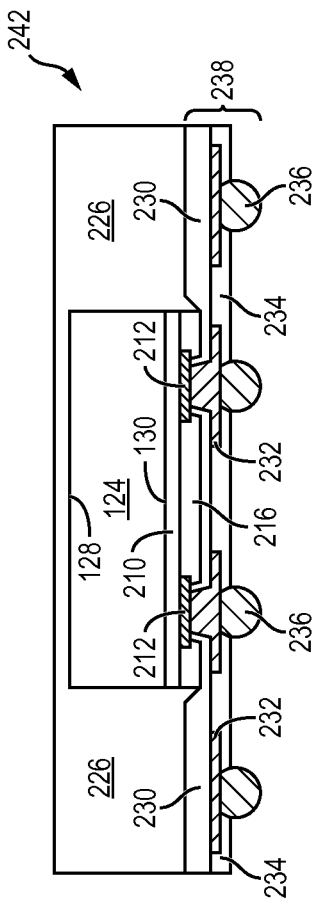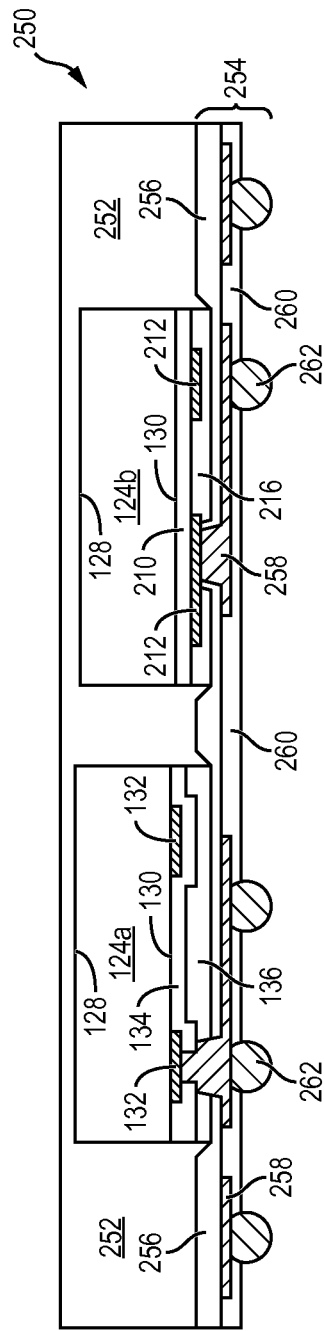

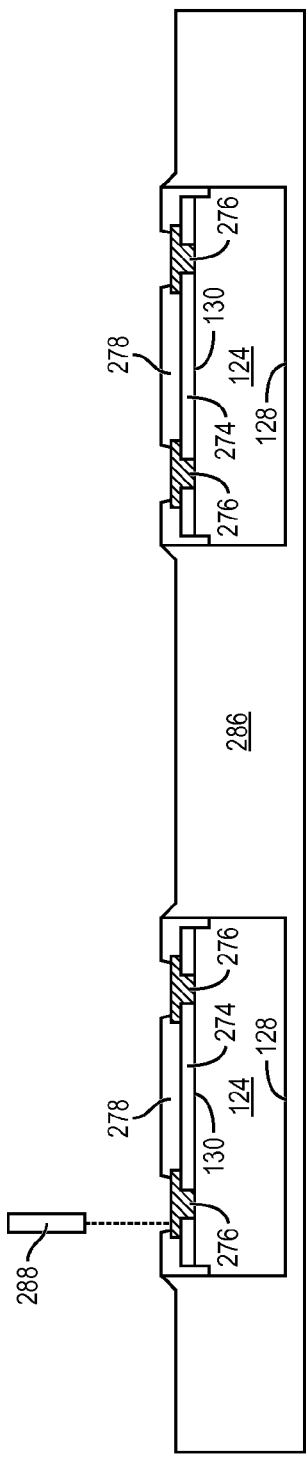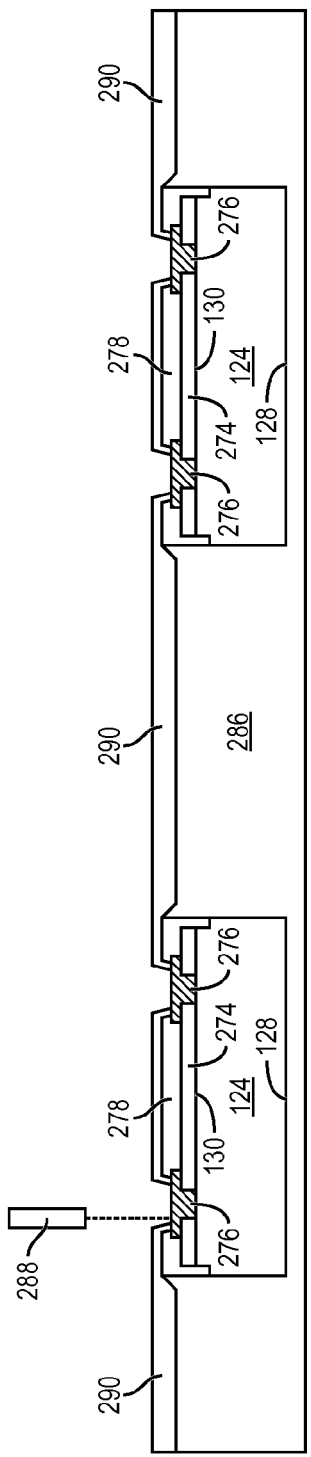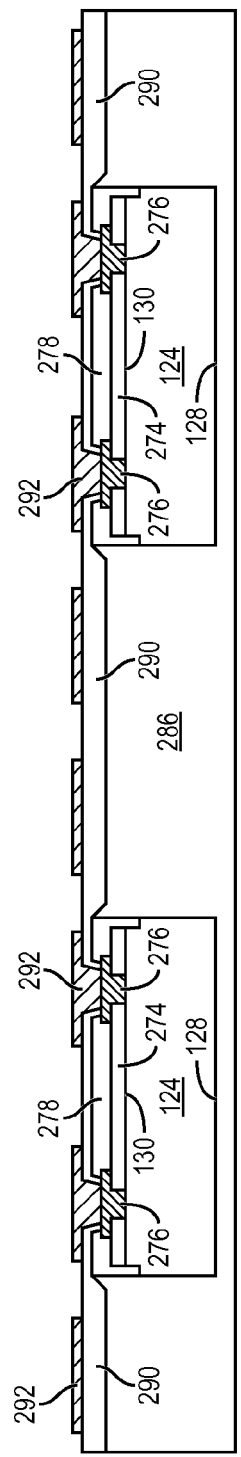

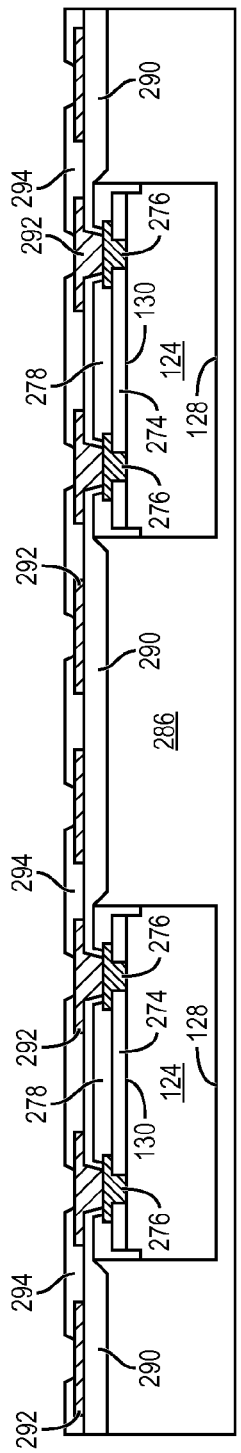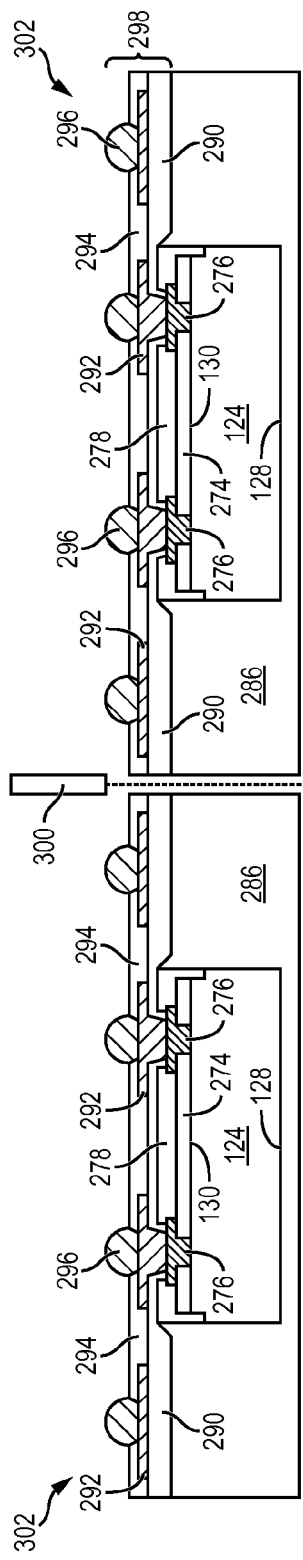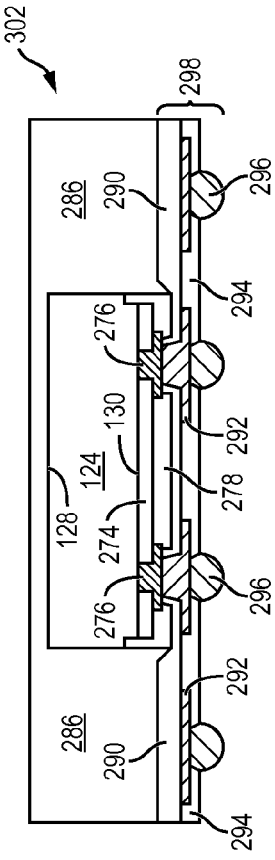

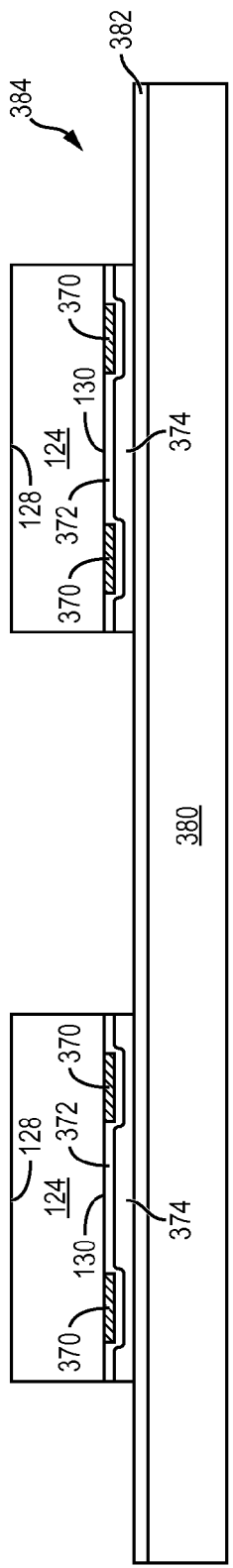
FIG. 18d
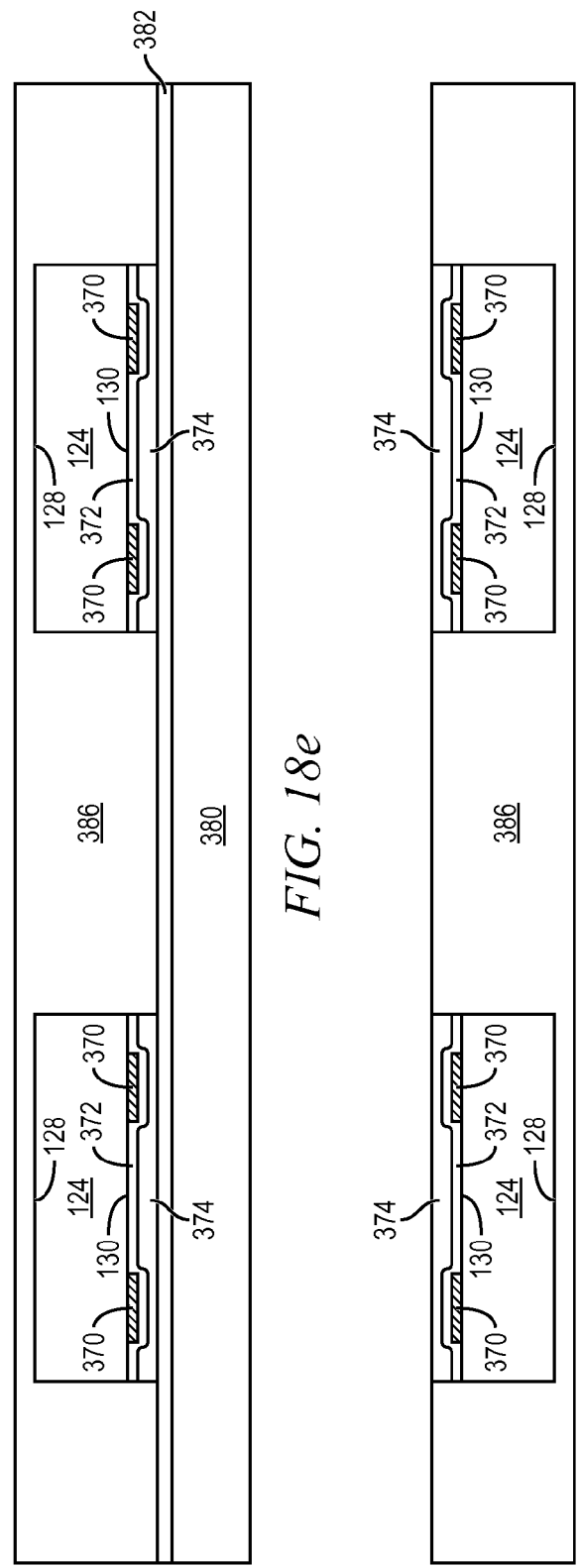
FIG. 18e
FIG. 18f

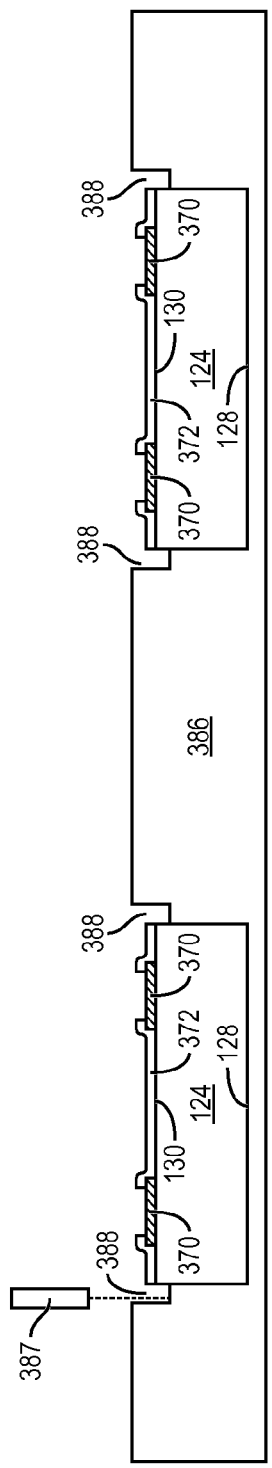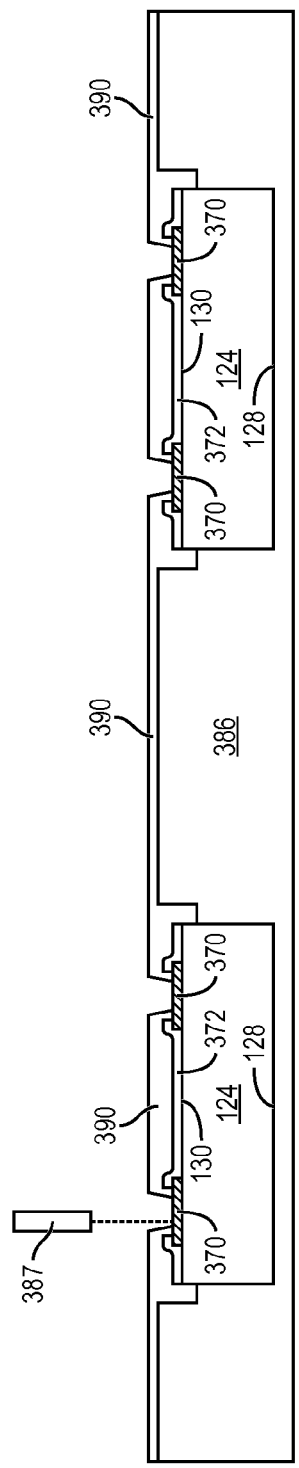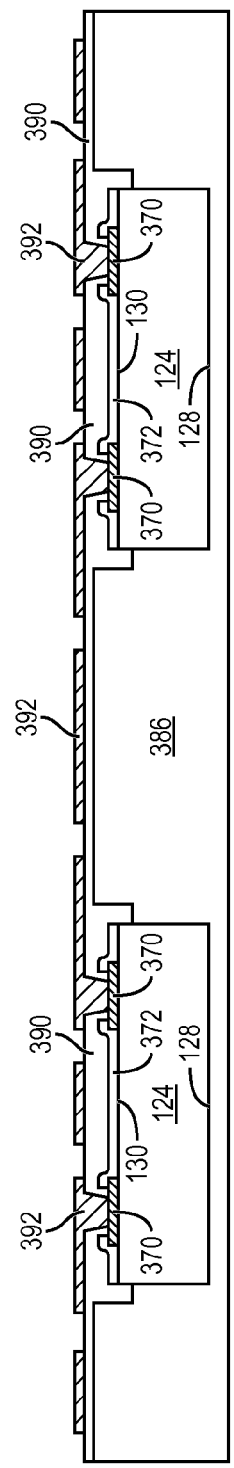

US 9,087,930 B2

SEMICONDUCTOR DEVICE AND METHOD OF FORMING INSULATING LAYER DISPOSED OVER THE SEMICONDUCTOR DIE FOR STRESS RELIEF

FIELD OF THE INVENTION

The present invention relates in general to semiconductor devices and, more particularly, to a semiconductor device and method of forming a WLCSP with an insulating layer disposed over the semiconductor die for stress relief.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

In a conventional fan-out wafer level chip scale package (Fo-WLCSP), a semiconductor die with contact pads is mounted to a carrier. An encapsulant is deposited over the semiconductor die and carrier. The carrier is removed and a build-up interconnect structure is formed over the encapsulant and semiconductor die. The semiconductor die is subject to cracking, warpage, and other damage during formation of the interconnect structure. The redistribution layers of the build-up interconnect structure are prone to cracking under stress, particularly during temperature cycling (TC) and temperature cycles on board (TCOB), which can propagate through the insulating layers to the semiconductor die and contact pads causing defects. The cracking can propagate into the semiconductor die from the edge and side walls of the die. The cracking problem is common in Fo-WLCSP having ultra-low dielectric constant (k) insulating layers.

SUMMARY OF THE INVENTION

A need exists for stress relief when forming a build-up interconnect structure in a WLCSP to avoid cracking, warpage, and other damage to the semiconductor die. Accordingly, in one embodiment, the present invention is a method of making a semiconductor device comprising the steps of providing a semiconductor die, forming a first stress relief layer over the semiconductor die, depositing an encapsulant over the semiconductor die and first stress relief layer, and forming an interconnect structure over the first stress relief layer.

In another embodiment, the present invention is a method of making a semiconductor device comprising the steps of providing a semiconductor die, depositing an encapsulant over the semiconductor die, forming a first insulating layer over the semiconductor die, and forming an interconnect structure over the first insulating layer and encapsulant.

In another embodiment, the present invention is a semiconductor device comprising a first semiconductor die. A first insulating layer is formed over the first semiconductor die. An encapsulant is deposited over the first semiconductor die and first insulating layer. A first conductive layer is formed over the first insulating layer.

In another embodiment, the present invention is a semiconductor device comprising a semiconductor die. An encapsulant is deposited over the semiconductor die. A first insulating layer is formed over the semiconductor die. A first conductive layer is formed over the first insulating layer.

BRIEF DESCRIPTION OF THE DRAWINGS

FIGS. 4a-4h illustrate a process of forming a WLCSP with an insulating layer disposed over the semiconductor die for stress relief;

FIG. 10 illustrates the Fo-WLCSP according to FIGS. 9a-9g with an insulating layer disposed over the semiconductor die for stress relief;

FIG. 11 illustrates the Fo-WLCSP with two semiconductor die each with an insulating layer disposed over the semiconductor die for stress relief;

FIGS. 12a-12l illustrate a process of forming a WLCSP with an insulating layer disposed over the semiconductor die and into a channel formed in the die for stress relief;

FIG. 13 illustrates the Fo-WLCSP according to FIGS. 12a-12l with an insulating layer disposed over the semiconductor die and into a channel formed in the die for stress relief;

FIGS. 18a-18j illustrate a process of forming a WLCSP with an insulating layer disposed over the die and encapsulant and into a channel formed in the encapsulant.

DETAILED DESCRIPTION OF THE DRAWINGS

Figure 1:
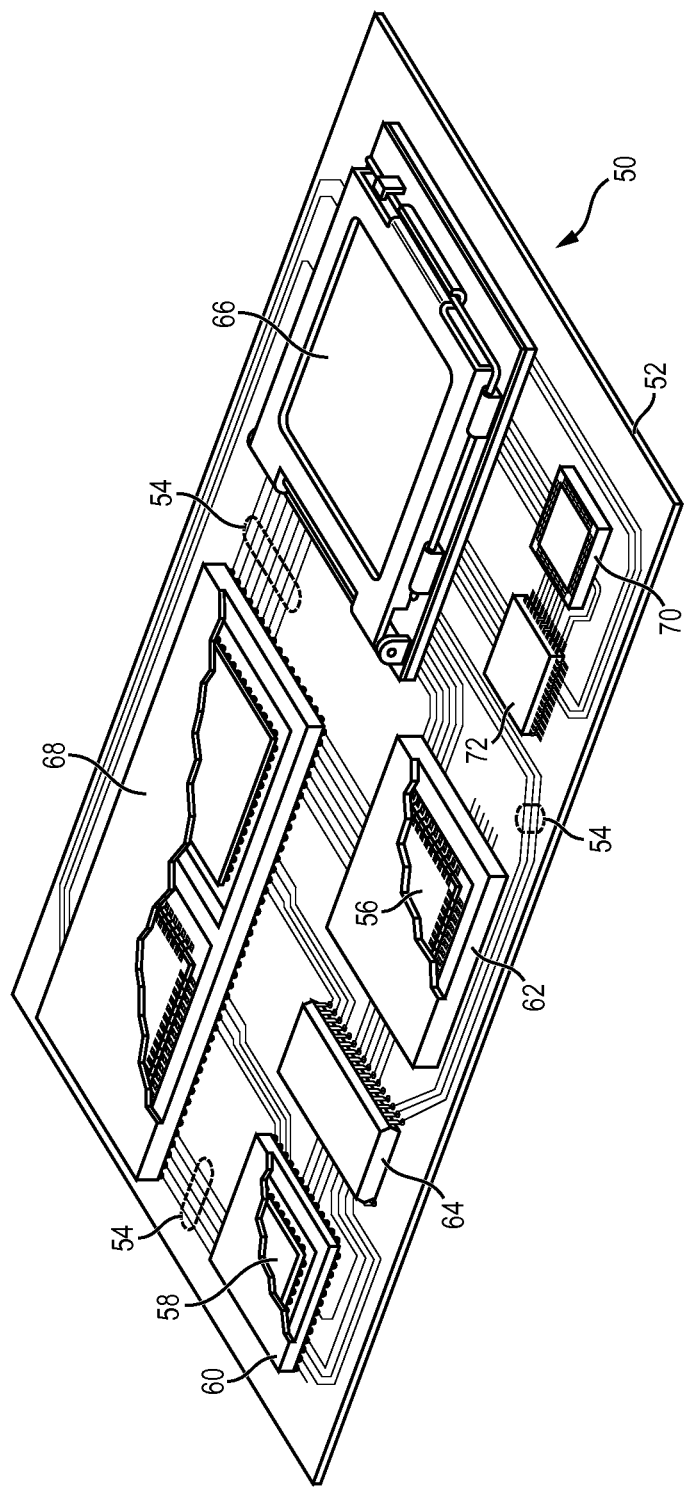
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
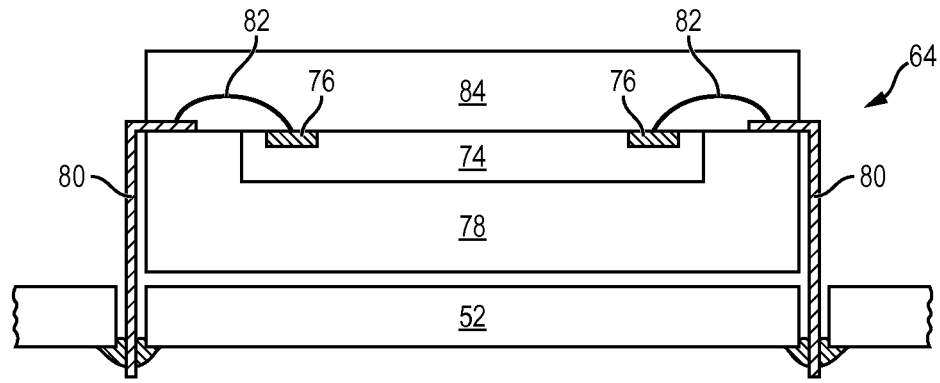
FIGS. 2a-2c illustrate further detail of the representative semiconductor packages mounted to the PCB.
Figure 2B:
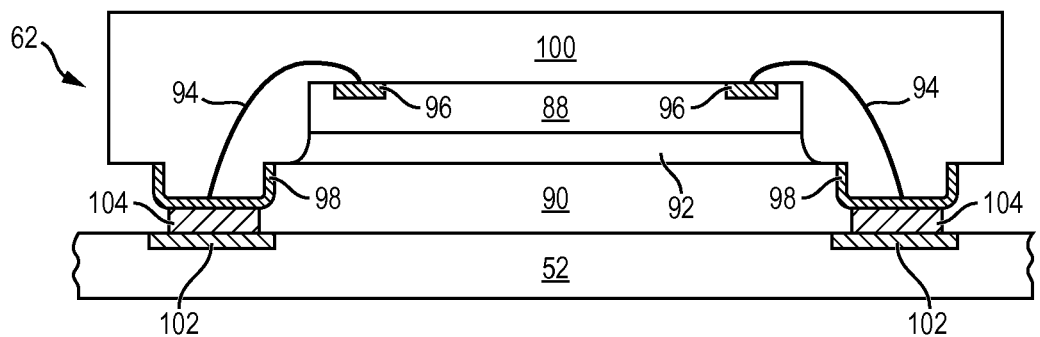
Figure 2C:
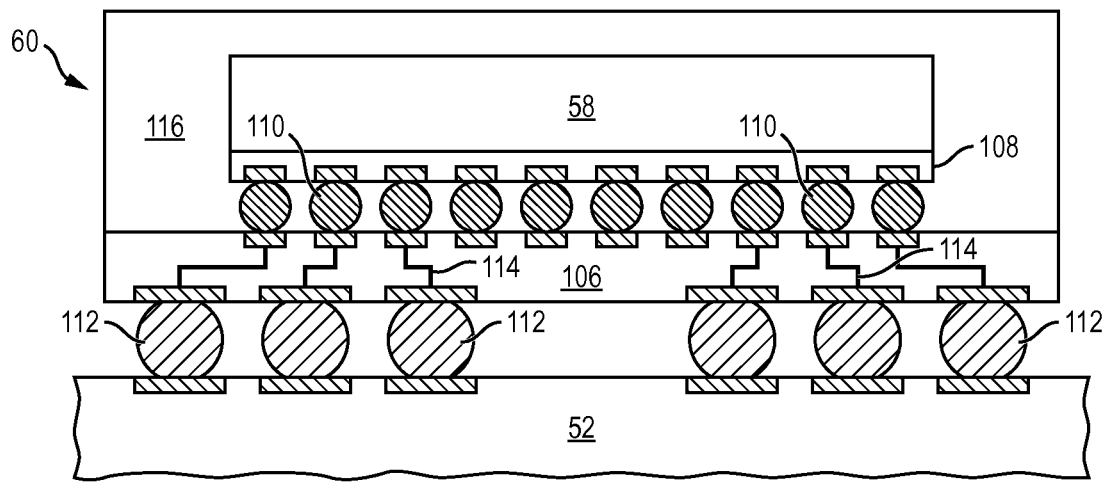

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
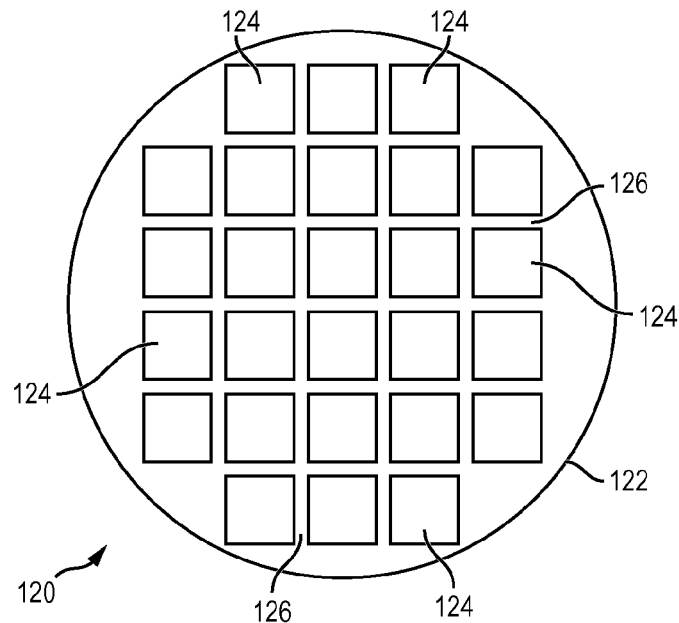
FIGS. 3a-3f illustrate a semiconductor wafer with a plurality of semiconductor die separated by saw streets.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
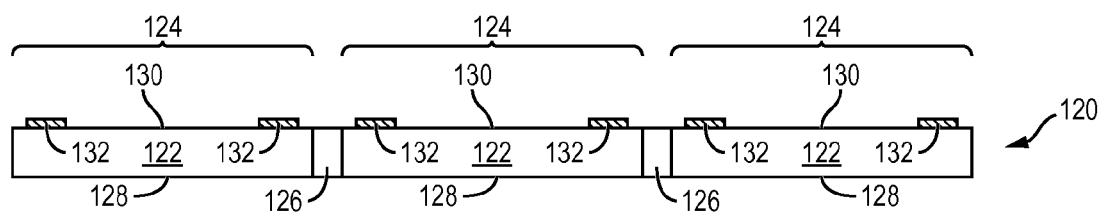

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 3b. Alternatively, contact pads 132 can be offset in multiple rows such that a first row of contact pads is disposed a first distance from the edge of the die, and a second row of contact pads alternating with the first row is disposed a second distance from the edge of the die.

Figure 3C:
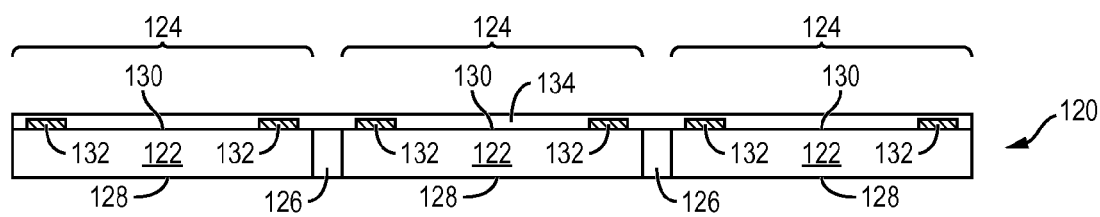

In FIG. 3c, an insulating or dielectric layer 134 is formed over active surface 130 and conductive layer 132 using spin coating, spray coating, printing, lamination, PVD, CVD, sintering or thermal oxidation. The insulating layer 134 contains one or more layers of silicon dioxide (SiO2), silicon nitride (Si3N4), silicon oxynitride (SiON), tantalum pentoxide (Ta2O5), aluminum oxide (Al2O3), benzocyclobutene (BCB), polyimide (PI), polybenzoxazoles (PBO), polymer matrix dielectric film, organic polymer film, or other material having similar insulating and structural properties. In one embodiment, insulating layer 134 is Si3N4 or SiON.

Figure 3D:
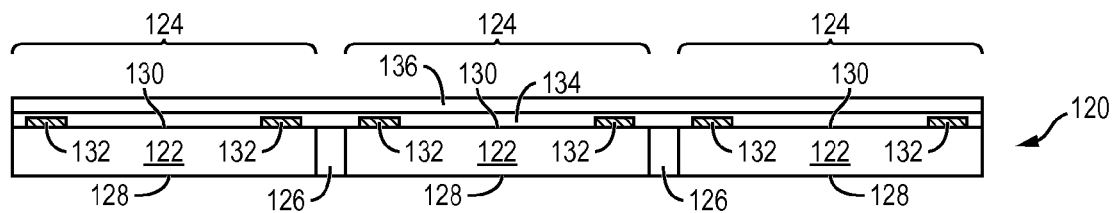

In FIG. 3d, an insulating or dielectric layer 136 is formed over insulating layer 134 using spin coating, spray coating, printing, lamination, PVD, CVD, sintering or thermal oxidation. In one embodiment, insulating layer 136 is applied as a blanket layer over insulating layer 134. The insulating layer 136 contains one or more layers of SiO2, Si3N4, SiON, Ta2O5, Al2O3, BCB, PI, PBO, polymer matrix dielectric film, organic polymer film, or other material having similar insulating and structural properties. The insulating layer 136 is cured. The insulating layer 136 operates as a stress relief layer to reduce cracking, warpage, or other damage to active surface 130 and conductive layer 132 of semiconductor die 124 during later formation of the build-up interconnect structure and for reliability purposes. In particular, insulating layer 136 has properties of a high tensile strength greater than 100 MPa at room temperature, high elongation between 20-150% at room temperature, and a thickness of 2-30 micrometers (μm).

Figure 3E:
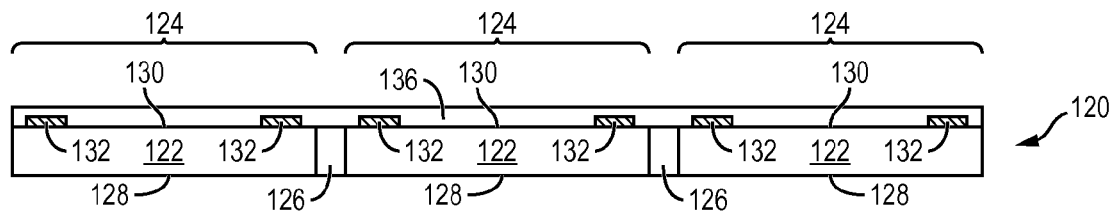

FIG. 3e shows an embodiment without insulating layer 134, i.e., insulating layer 136 formed over active surface 130 and conductive layer 132 for stress relief.

Figure 3F:
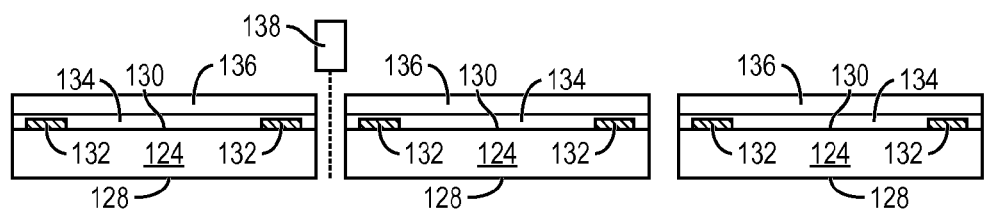

In FIG. 3f, semiconductor wafer 120 is singulated through saw street 126 using a cutting tool 138, such as a saw blade, water jet, or laser, into individual semiconductor die 124.

Figure 4D:
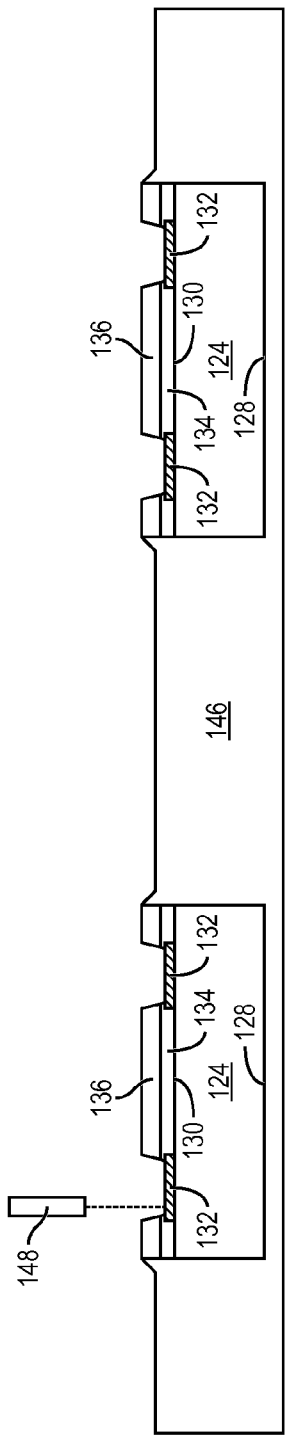

FIGS. 4a-4h illustrate, in relation to FIGS. 1 and 2a-2c, a process of forming a WLCSP with an insulating layer disposed over the semiconductor die for stress relief. FIG. 4a shows a temporary substrate or carrier 140 containing sacrificial base material such as silicon, polymer, beryllium oxide, or other suitable low-cost, rigid material for structural support. An interface layer or double-sided tape 142 is formed over carrier 140 as a temporary adhesive bonding film or etch-stop layer. Semiconductor die 124 from FIGS. 3a-3f are positioned over and mounted to interface layer 142 and carrier 140 using a pick and place operation with active surface 130 oriented toward the carrier. FIG. 4b shows semiconductor die 124 mounted to carrier 140 to illustrate a portion of reconfigured or reconstituted wafer 144.

In FIG. 4c, an encapsulant or molding compound 146 is deposited over semiconductor die 124 and carrier 140 using a paste printing, compressive molding, transfer molding, liquid encapsulant molding, vacuum lamination, spin coating, or other suitable applicator. Encapsulant 146 can be polymer composite material, such as epoxy resin with filler, epoxy acrylate with filler, or polymer with proper filler. Encapsulant 146 is non-conductive and environmentally protects the semiconductor device from external elements and contaminants.

In FIG. 4d, carrier 140 and interface layer 142 are removed by chemical etching, mechanical peeling, CMP, mechanical grinding, thermal bake, UV light, laser scanning, or wet stripping to expose insulating layer 136 and encapsulant 146. Encapsulant 146 provides structural support for semiconductor die 124 after removal of carrier 140. A portion of insulating layers 134 and 136 is removed by an etching process with a patterned photoresist layer (not shown) to expose conductive layer 132. The etching process also removes a portion of encapsulant 146 to a level below a surface of insulating layer 136, as shown in FIG. 4d. Alternatively, a portion of insulating layers 134 and 136 is removed by laser direct ablation (LDA) using laser 148 to expose conductive layer 132. The insulating layers 134 and 136 remain overlapping conductive layer 132 after etching or LDA.

In another embodiment, insulating layers 134 and 136 are formed after depositing encapsulant 146 over semiconductor die 124. In this case, a portion of encapsulant 146 is removed to expose active surface 130 and conductive layer 132. The insulating layers 134 and 136 are then formed over the exposed active surface 130 and conductive layer 132. A portion of insulating layers 134 and 136 is removed by LDA or etching to expose conductive layer 132.

Figure 4E:
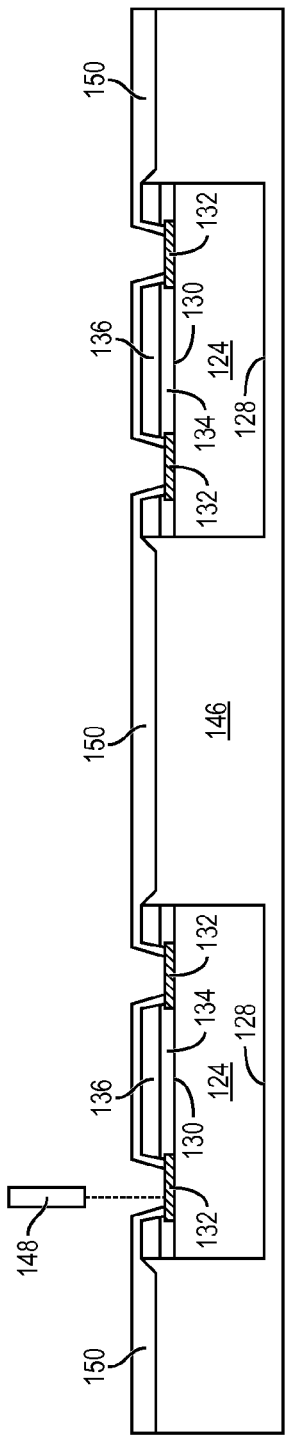

In FIG. 4e, an insulating or passivation layer 150 is formed over encapsulant 146 and insulating layer 136 using PVD, CVD, printing, spin coating, spray coating, screen printing or lamination. The insulating layer 150 contains one or more layers of SiO2, Si3N4, SiON, Ta2O5, Al2O3, polymer dielectric film, or other material having similar insulating and structural properties. A portion of insulating layer 150 is removed by an etching process with a patterned photoresist layer to expose conductive layer 132. Alternatively, a portion of insulating layer 150, as well as insulating layers 134 and 136, are removed by LDA using laser 148 to expose conductive layer 132.

Figure 4F:
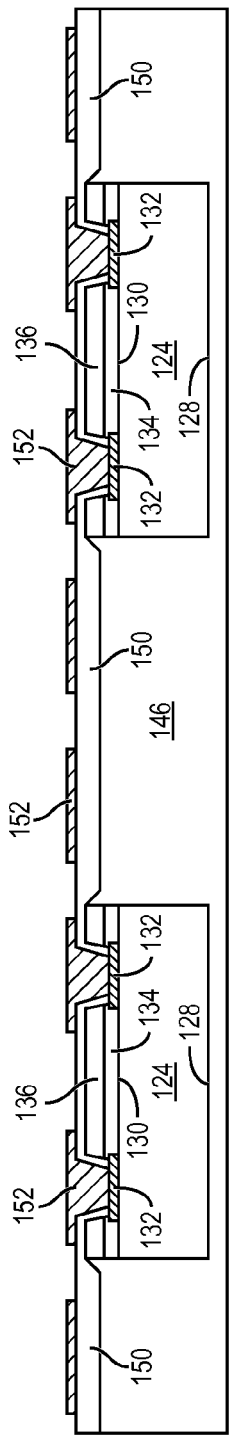

In FIG. 4f, an electrically conductive layer 152 is formed over insulating layer 150 and conductive layer 132 using patterning with PVD, CVD, sputtering, electrolytic plating, electroless plating process, or other suitable metal deposition process. Conductive layer 152 can be one or more layers of Al, Cu, Sn, Ni, Au, Ag, or other suitable electrically conductive material. A portion of conductive layer 152 extends horizontally along insulating layer 150 and parallel to active surface 130 of semiconductor die 124 to laterally redistribute the electrical interconnect to conductive layer 132. Conductive layer 152 operates as a fan-out redistribution layer (RDL) for the electrical signals of semiconductor die 124. A portion of conductive layer 152 is electrically connected to conductive layer 132. Other portions of conductive layer 152 are electrically common or electrically isolated depending on the connectivity of semiconductor die 124.

Figure 4G:
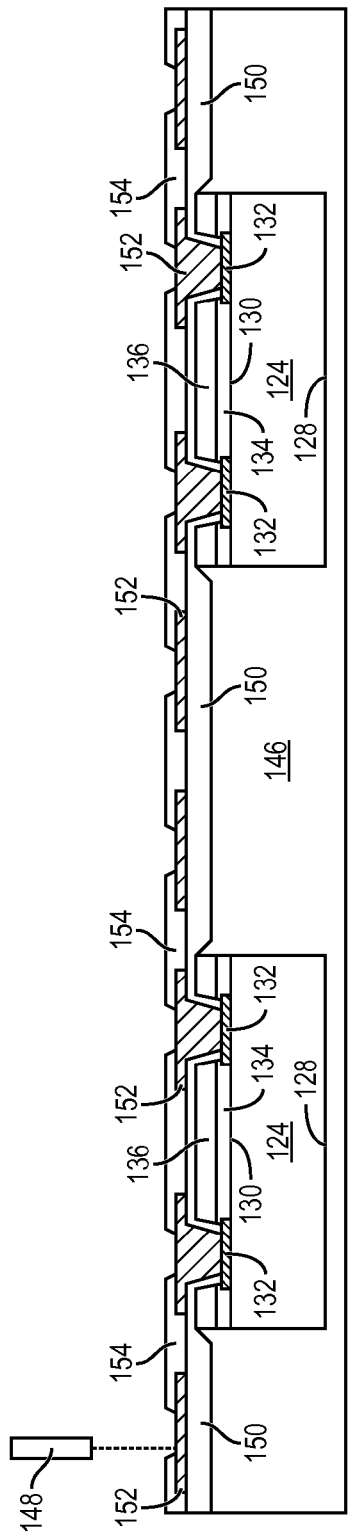

In FIG. 4g, an insulating or passivation layer 154 is formed over insulating layer 150 and conductive layer 152 using PVD, CVD, printing, spin coating, spray coating, screen printing or lamination. The insulating layer 154 can be one or more layers of SiO2, Si3N4, SiON, Ta2O5, Al2O3, polymer dielectric film, or other material having similar insulating and structural properties. A portion of insulating layer 154 is removed by an etching process with a patterned photoresist layer to expose conductive layer 152. Alternatively, a portion of insulating layer 154 is removed by LDA using laser 148 to expose conductive layer 152.

Figure 4H:
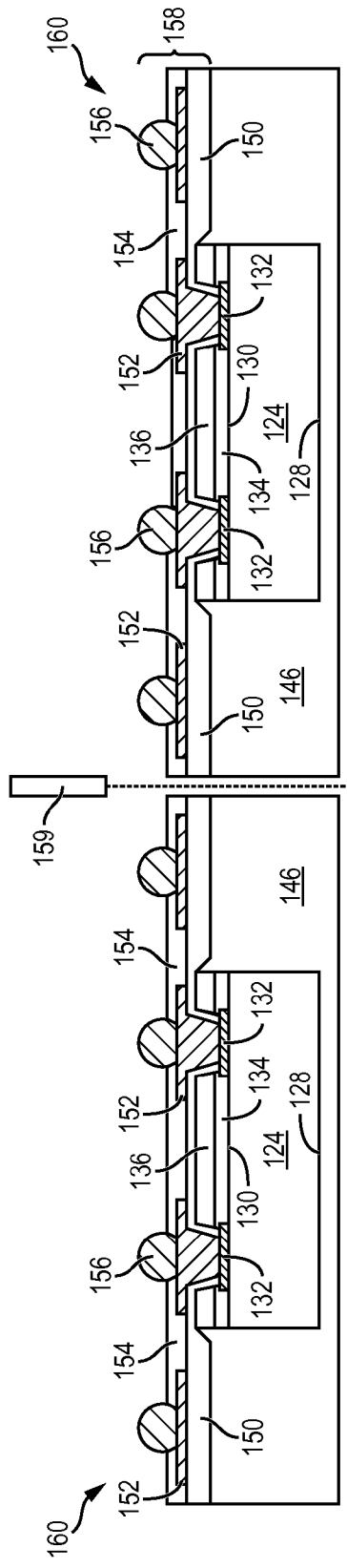

In FIG. 4h, an electrically conductive bump material is deposited over the exposed conductive layer 152 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 152 using a suitable attachment or bonding process. In one embodiment, the bump material is reflowed by heating the material above its melting point to form balls or bumps 156. In some applications, bumps 156 are reflowed a second time to improve electrical contact to conductive layer 152. Bumps 156 can also be compression bonded to conductive layer 152. Bumps 156 represent one type of interconnect structure that can be formed over conductive layer 152. The interconnect structure can also use stud bump, micro bump, or other electrical interconnect.

The combination of insulating layers 150 and 154, conductive layer 152, and bumps 156 constitute a build-up interconnect structure 158 formed over semiconductor die 124 and encapsulant 146. Additional insulating layers and RDLs can be formed in build-up interconnect structure 158 for interconnection to semiconductor die 124. The reconstituted wafer 144 is singulated through encapsulant 146 and build-up interconnect structure 158 with saw blade or laser cutting tool 159 into individual Fo-WLCSP 160.

Figure 5:
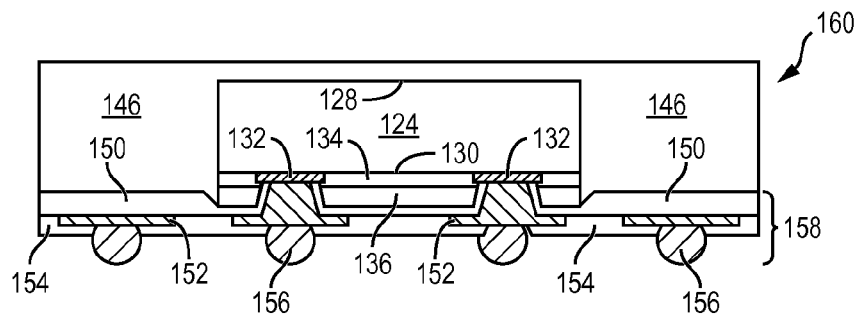
FIG. 5 illustrates the Fo-WLCSP according to FIGS. 4a-4h with an insulating layer disposed over the semiconductor die for stress relief.

FIG. 5 shows Fo-WLCSP 160 after singulation. Semiconductor die 124 is electrically connected through build-up interconnect structure 158, including conductive layer 152 and bumps 156, to external devices. In one embodiment, insulating layer 136 is formed over semiconductor die 124 prior to singulation from wafer 120. The properties of insulating layer 136, i.e., high tensile strength greater than 100 MPa at room temperature, high elongation between 20-150% at room temperature, and a thickness of 2-30 μm, provides stress relief to reduce cracking, warpage, and other damage to the die during the formation of build-up interconnect structure 158, including insulating layers 150 and 154 and conductive layer 152.

Figure 6:
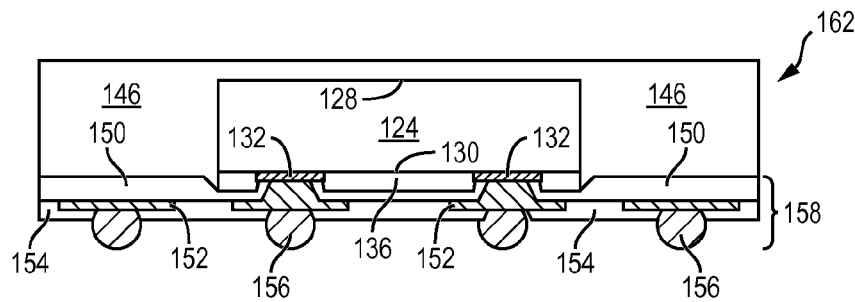
FIG. 6 illustrates the Fo-WLCSP according to FIG. 3e with an insulating layer disposed over the semiconductor die for stress relief.

FIG. 6 shows Fo-WLCSP 162 based on FIG. 3e without insulating layer 134. Semiconductor die 124 is electrically connected through build-up interconnect structure 158, including conductive layer 152 and bumps 156, to external devices. In one embodiment, insulating layer 136 is formed over semiconductor die 124 prior to singulation from wafer 120. The properties of insulating layer 136, i.e., high tensile strength greater than 100 MPa at room temperature, high elongation between 20-150% at room temperature, and a thickness of 2-30 μm, provides stress relief to reduce cracking, warpage, and other damage to the die during the formation of build-up interconnect structure 158, including insulating layers 150 and 154 and conductive layer 152.

Figure 7A:
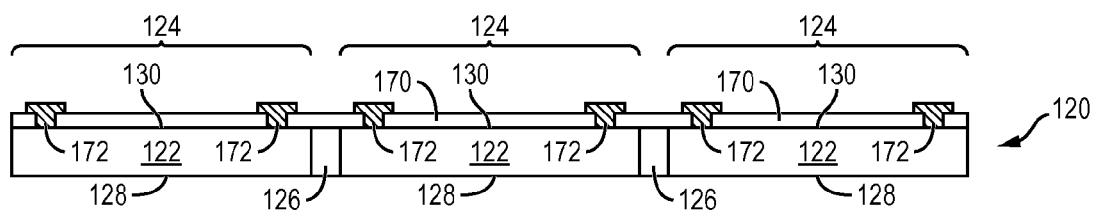
FIGS. 7a-7g illustrate another process of forming a WLCSP with an insulating layer disposed over the semiconductor die for stress relief.

FIGS. 7a-7g illustrate, in relation to FIGS. 1 and 2a-2c, another process of forming a WLCSP with an insulating layer disposed over the semiconductor die for stress relief. Continuing from FIG. 3a, an insulating or dielectric layer 170 is formed over active surface 130 using spin coating, spray coating, printing, lamination, PVD, CVD, sintering or thermal oxidation, as shown in FIG. 7a. The insulating layer 170 contains one or more layers of SiO2, Si3N4, SiON, Ta2O5, Al2O3, BCB, PI, PBO, polymer matrix dielectric film, organic polymer film, or other material having similar insulating and structural properties. In one embodiment, insulating layer 170 is Si3N4 or SiON. A portion of insulating layer 170 is removed by an etching process with a patterned photoresist layer to expose active surface 130.

An electrically conductive layer 172 is formed over insulating layer 170 and active surface 130 using PVD, CVD, electrolytic plating, electroless plating process, or other suitable metal deposition process. Conductive layer 172 can be one or more layers of Al, Cu, Sn, Ni, Au, Ag, or other suitable electrically conductive material. Conductive layer 172 operates as contact pads overlapping insulating layer 170 and electrically connected to the circuits on active surface 130.

Figure 7B:
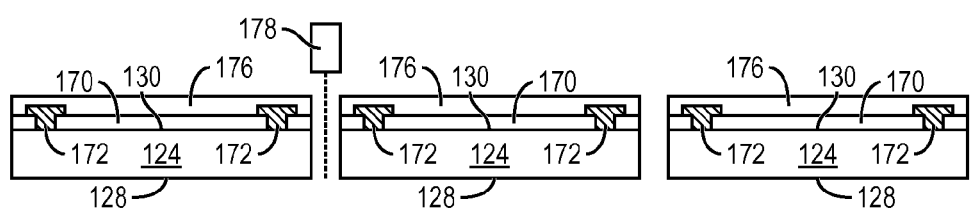

In FIG. 7b, an insulating or dielectric layer 176 is formed over insulating layer 170 and conductive layer 172 using spin coating, spray coating, printing, lamination, PVD, CVD, sintering or thermal oxidation. In one embodiment, insulating layer 176 is applied as a blanket layer over insulating layer 170 and conductive layer 172. The insulating layer 176 contains one or more layers of SiO2, Si3N4, SiON, Ta2O5, Al2O3, BCB, PI, PBO, polymer matrix dielectric film, organic polymer film, or other material having similar insulating and structural properties. The insulating layer 176 is cured. The insulating layer 176 operates as a stress relief layer to reduce cracking, warpage, or other damage to active surface 130 and conductive layer 172 of semiconductor die 124 during later formation of the build-up interconnect structure. In particular, insulating layer 176 has properties of a high tensile strength greater than 100 MPa at room temperature, high elongation between 20-150% at room temperature, and a thickness of 2-30 μm.

Semiconductor wafer 120 is singulated through saw street 126 using a cutting tool 178, such as a saw blade, water jet, or laser, into individual semiconductor die 124.

Figure 7C:
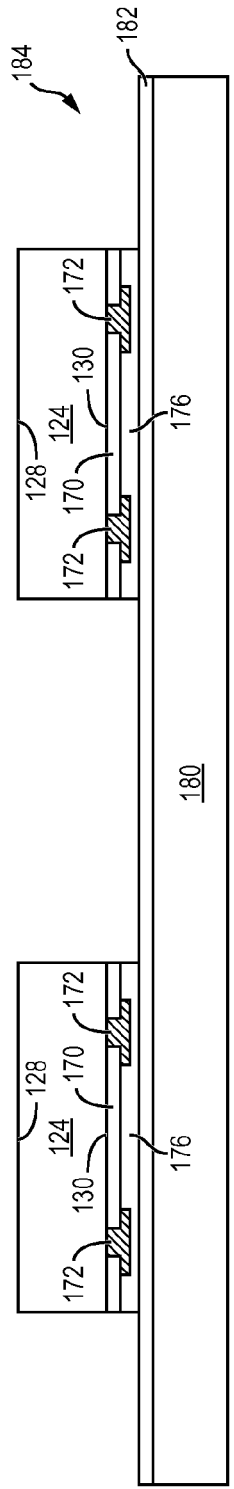

FIG. 7c shows a temporary substrate or carrier 180 containing sacrificial base material such as silicon, polymer, beryllium oxide, or other suitable low-cost, rigid material for structural support. An interface layer or double-sided tape 182 is formed over carrier 180 as a temporary adhesive bonding film or etch-stop layer. Semiconductor die 124 from FIGS. 7a-7b are positioned over and mounted to interface layer 182 and carrier 180 using a pick and place operation with active surface 130 oriented toward the carrier. Semiconductor die 124 mounted to carrier 180 constitute reconfigured wafer 184.

Figure 7D:
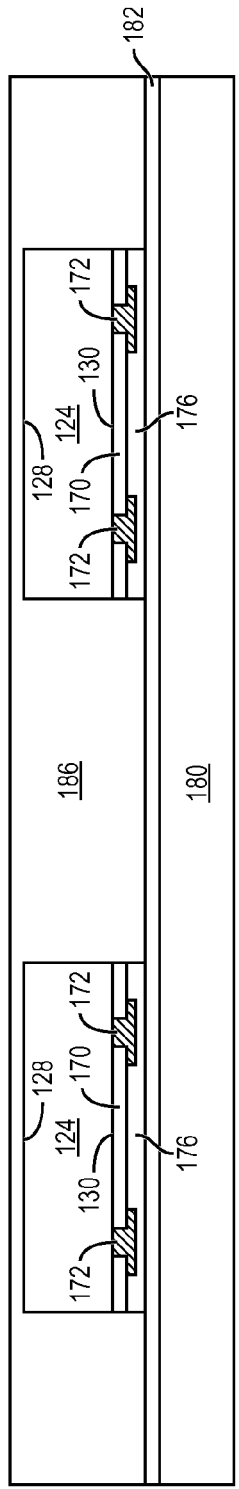

In FIG. 7d, an encapsulant or molding compound 186 is deposited over semiconductor die 124 and carrier 180 using a paste printing, compressive molding, transfer molding, liquid encapsulant molding, vacuum lamination, spin coating, or other suitable applicator. Encapsulant 186 can be polymer composite material, such as epoxy resin with filler, epoxy acrylate with filler, or polymer with proper filler. Encapsulant 186 is non-conductive and environmentally protects the semiconductor device from external elements and contaminants.

Figure 7E:
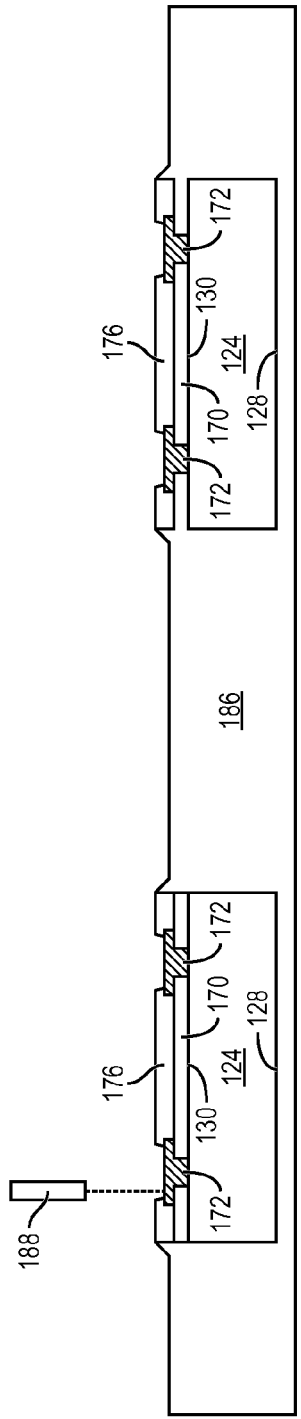

In FIG. 7e, carrier 180 and interface layer 182 are removed by chemical etching, mechanical peeling, CMP, mechanical grinding, thermal bake, UV light, laser scanning, or wet stripping to expose insulating layer 176 and encapsulant 186. Encapsulant 186 provides structural support for semiconductor die 124 after removal of carrier 180. A portion of insulating layer 176 is removed by an etching process with a patterned photoresist layer to expose conductive layer 172. The etching process also removes a portion of encapsulant 186 to a level below a surface of insulating layer 176. Alternatively, a portion of insulating layer 176 is removed by LDA using laser 188 to expose conductive layer 172. The insulating layer 176 remains overlapping conductive layer 172 after etching or LDA.

Figure 7F:
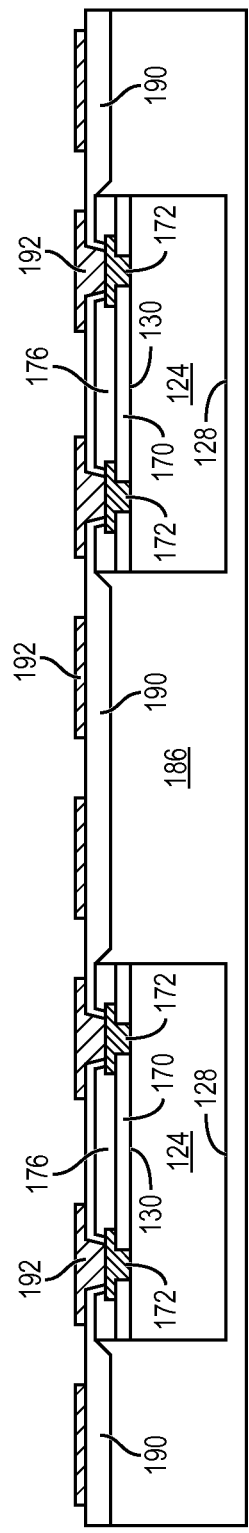

In FIG. 7f, an insulating or passivation layer 190 is formed over encapsulant 186, insulating layer 176, and conductive layer 172 using PVD, CVD, printing, spin coating, spray coating, screen printing or lamination. The insulating layer 190 contains one or more layers of SiO2, Si3N4, SiON, Ta2O5, Al2O3, polymer dielectric film, or other material having similar insulating and structural properties. A portion of insulating layer 190 is removed by an etching process with a patterned photoresist layer to expose conductive layer 172. Alternatively, a portion of insulating layer 190 is removed by LDA to expose conductive layer 172.

An electrically conductive layer 192 is formed over insulating layer 190 and conductive layer 172 using patterning with PVD, CVD, sputtering, electrolytic plating, electroless plating process, or other suitable metal deposition process. Conductive layer 192 can be one or more layers of Al, Cu, Sn, Ni, Au, Ag, or other suitable electrically conductive material. A portion of conductive layer 192 extends horizontally along insulating layer 190 and parallel to active surface 130 of semiconductor die 124 to laterally redistribute the electrical interconnect to conductive layer 172. Conductive layer 192 operates as a fan-out RDL for the electrical signals of semiconductor die 124. A portion of conductive layer 192 is electrically connected to conductive layer 172. Other portions of conductive layer 192 are electrically common or electrically isolated depending on the connectivity of semiconductor die 124.

Figure 7G:
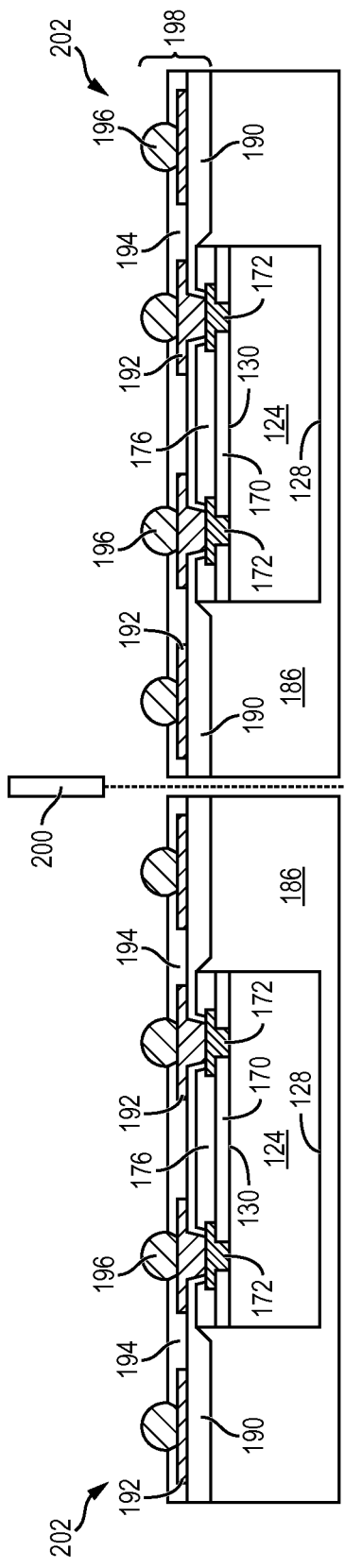

In FIG. 7g, an insulating or passivation layer 194 is formed over insulating layer 190 and conductive layer 192 using PVD, CVD, printing, spin coating, spray coating, screen printing or lamination. The insulating layer 194 can be one or more layers of SiO2, Si3N4, SiON, Ta2O5, Al2O3, polymer dielectric film, or other material having similar insulating and structural properties. A portion of insulating layer 194 is removed by an etching process with a patterned photoresist layer to expose conductive layer 192. Alternatively, a portion of insulating layer 194 is removed by LDA to expose conductive layer 192.

An electrically conductive bump material is deposited over the exposed conductive layer 192 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 192 using a suitable attachment or bonding process. In one embodiment, the bump material is reflowed by heating the material above its melting point to form balls or bumps 196. In some applications, bumps 196 are reflowed a second time to improve electrical contact to conductive layer 192. Bumps 196 can also be compression bonded to conductive layer 192. Bumps 196 represent one type of interconnect structure that can be formed over conductive layer 192. The interconnect structure can also use stud bump, micro bump, or other electrical interconnect.

The combination of insulating layers 190 and 194, conductive layer 192, and bumps 196 constitute a build-up interconnect structure 198 formed over semiconductor die 124 and encapsulant 186. Additional insulating layers and RDLs can be formed in build-up interconnect structure 198 for interconnection to semiconductor die 124. The reconstituted wafer 184 is singulated through encapsulant 186 and build-up interconnect structure 198 with saw blade or laser cutting tool 200 into individual Fo-WLCSP 202.

Figure 8:
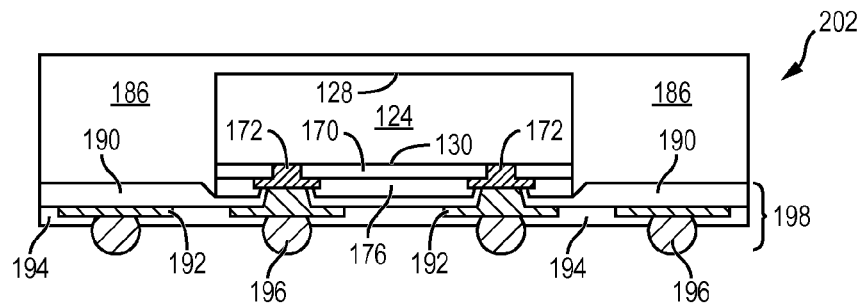
FIG. 8 illustrates the Fo-WLCSP according to FIGS. 7a-7g with an insulating layer disposed over the semiconductor die for stress relief.

FIG. 8 shows Fo-WLCSP 202 after singulation. Semiconductor die 124 is electrically connected through build-up interconnect structure 198, including conductive layer 192 and bumps 196, to external devices. In one embodiment, insulating layer 176 is formed over semiconductor die 124 prior to singulation from wafer 120. The properties of insulating layer 176, i.e., high tensile strength greater than 100 MPa at room temperature, high elongation between 20-150% at room temperature, and a thickness of 2-30 μm, provides stress relief to reduce cracking, warpage, and other damage to the die during the formation of build-up interconnect structure 198, including insulating layers 190 and 194 and conductive layer 192.

Figure 9A:
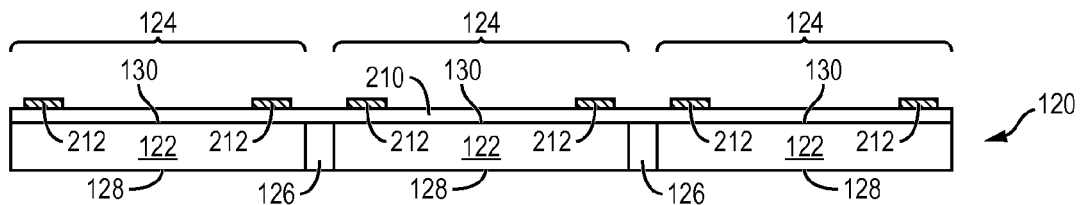
FIGS. 9a-9g illustrate a process of forming a WLCSP with multiple insulating layers disposed over the semiconductor die for stress relief.

FIGS. 9a-9g illustrate, in relation to FIGS. 1 and 2a-2c, a process of forming a WLCSP with multiple insulating layers disposed over the semiconductor die for stress relief. Continuing from FIG. 3a, an insulating or dielectric layer 210 is formed over active surface 130 using spin coating, spray coating, printing, lamination, PVD, CVD, sintering or thermal oxidation, as shown in FIG. 9a. In one embodiment, insulating layer 210 is applied as a blanket layer over active surface 130. The insulating layer 210 contains one or more layers of SiO2, Si3N4, SiON, Ta2O5, Al2O3, BCB, PI, PBO, polymer matrix dielectric film, organic polymer film, or other material having similar insulating and structural properties. The insulating layer 210 is cured. The insulating layer 210 operates as a first stress relief layer to reduce cracking, warpage, or other damage to active surface 130 and conductive layer 212 of semiconductor die 124 during later formation of the build-up interconnect structure. In particular, insulating layer 210 has properties of a high tensile strength greater than 100 MPa at room temperature, high elongation between 20-150% at room temperature, and a thickness of 2-30 μm.

An electrically conductive layer 212 is formed over insulating layer 210 using PVD, CVD, electrolytic plating, electroless plating process, or other suitable metal deposition process. Conductive layer 212 can be one or more layers of Al, Cu, Sn, Ni, Au, Ag, or other suitable electrically conductive material. Conductive layer 212 operates as contact pads electrically connected to the circuits on active surface 130.

Figure 9B:
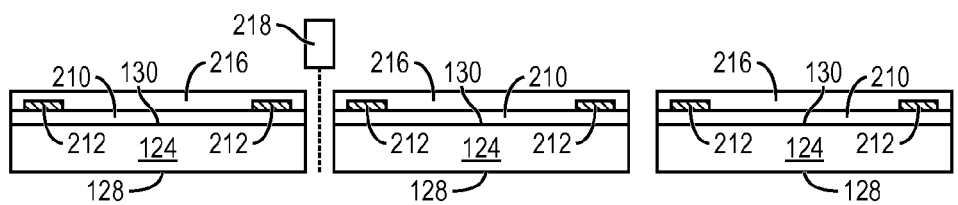

In FIG. 9b, an insulating or dielectric layer 216 is formed over insulating layer 210 and conductive layer 212 using spin coating, spray coating, printing, lamination, PVD, CVD, sintering or thermal oxidation. In one embodiment, insulating layer 216 is applied as a blanket layer over insulating layer 210 and conductive layer 212. The insulating layer 216 contains one or more layers of SiO2, Si3N4, SiON, Ta2O5, Al2O3, BCB, PI, PBO, polymer matrix dielectric film, organic polymer film, or other material having similar insulating and structural properties. The insulating layer 216 is cured. The insulating layer 216 operates as a second stress relief layer to reduce cracking, warpage, or other damage to active surface 130 and conductive layer 212 of semiconductor die 124 during later formation of the build-up interconnect structure. In particular, insulating layer 216 has properties of a high tensile strength greater than 100 MPa at room temperature, high elongation between 20-150% at room temperature, and a thickness of 2-30 μm.

Semiconductor wafer 120 is singulated through saw street 126 using a cutting tool 218, such as a saw blade, water jet, or laser, into individual semiconductor die 124.

Figure 9C:
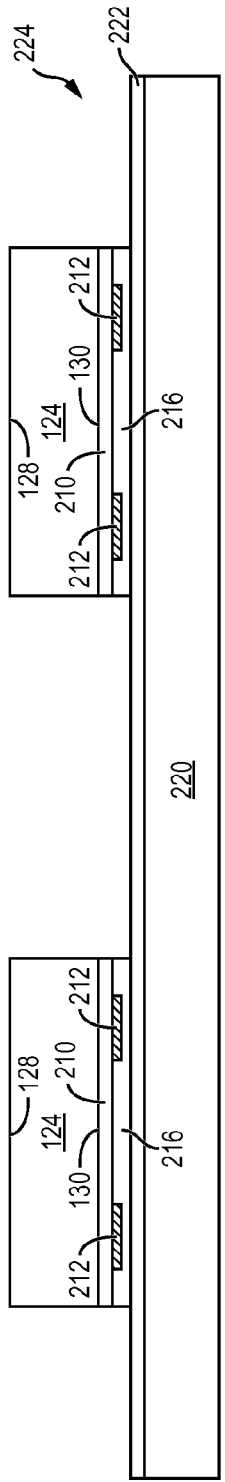

FIG. 9c shows a temporary substrate or carrier 220 containing sacrificial base material such as silicon, polymer, beryllium oxide, or other suitable low-cost, rigid material for structural support. An interface layer or double-sided tape 222 is formed over carrier 220 as a temporary adhesive bonding film or etch-stop layer. Semiconductor die 124 from FIGS. 9a-9b are positioned over and mounted to interface layer 222 and carrier 220 using a pick and place operation with active surface 130 oriented toward the carrier. Semiconductor die 124 mounted to carrier 220 constitute reconfigured wafer 224.

Figure 9D:
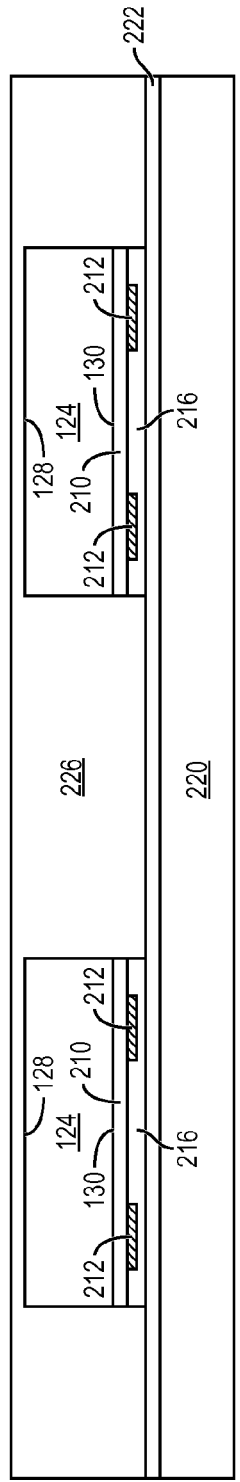

In FIG. 9d, an encapsulant or molding compound 226 is deposited over semiconductor die 124 and carrier 220 using a paste printing, compressive molding, transfer molding, liquid encapsulant molding, vacuum lamination, spin coating, or other suitable applicator. Encapsulant 226 can be polymer composite material, such as epoxy resin with filler, epoxy acrylate with filler, or polymer with proper filler. Encapsulant 226 is non-conductive and environmentally protects the semiconductor device from external elements and contaminants.

Figure 9E:
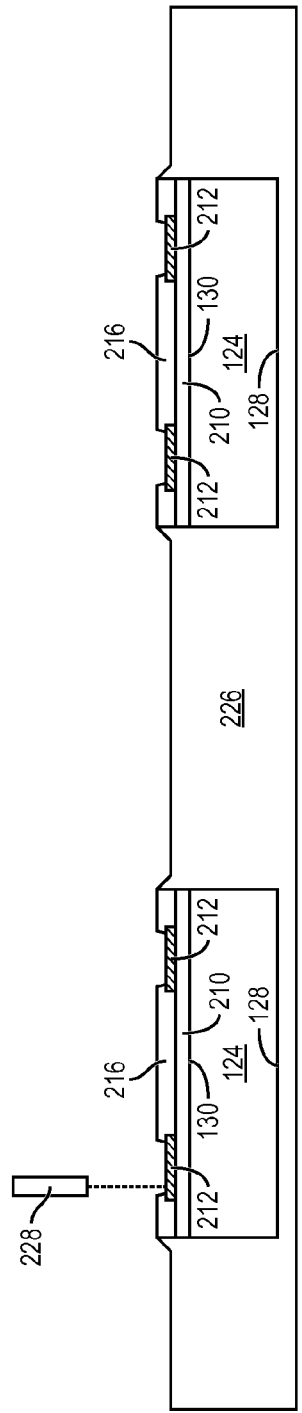

In FIG. 9e, carrier 220 and interface layer 222 are removed by chemical etching, mechanical peeling, CMP, mechanical grinding, thermal bake, UV light, laser scanning, or wet stripping to expose insulating layer 216 and encapsulant 226. Encapsulant 226 provides structural support for semiconductor die 124 after removal of carrier 220. A portion of insulating layer 216 is removed by an etching process with a patterned photoresist layer to expose conductive layer 212. The etching process also removes a portion of encapsulant 226 to a level below a surface of insulating layer 216. Alternatively, a portion of insulating layer 216 is removed by LDA using laser 228 to expose conductive layer 212. The insulating layer 216 remains overlapping conductive layer 212 after etching or LDA.

Figure 9F:
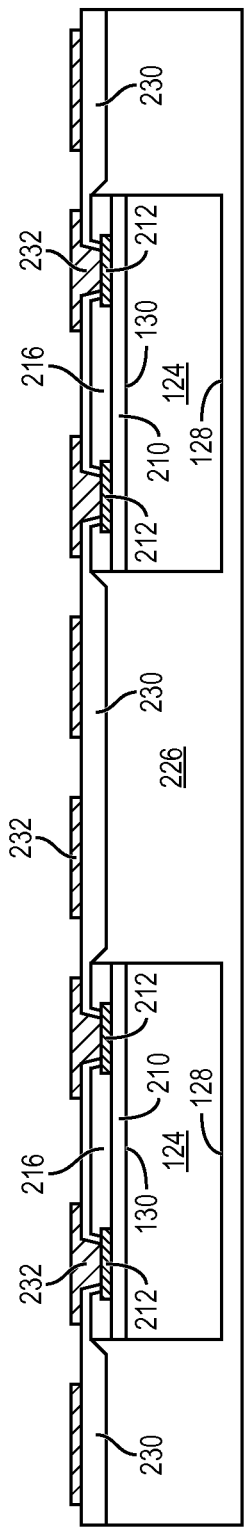

In FIG. 9f, an insulating or passivation layer 230 is formed over encapsulant 226, insulating layer 216, and conductive layer 212 using PVD, CVD, printing, spin coating, spray coating, screen printing or lamination. The insulating layer 230 contains one or more layers of SiO2, Si3N4, SiON, Ta2O5, Al2O3, polymer dielectric film, or other material having similar insulating and structural properties. A portion of insulating layer 230 is removed by an etching process with a patterned photoresist layer to expose conductive layer 212. Alternatively, a portion of insulating layer 230 is removed by LDA to expose conductive layer 212.

An electrically conductive layer 232 is formed over insulating layer 230 and conductive layer 212 using patterning with PVD, CVD, sputtering, electrolytic plating, electroless plating process, or other suitable metal deposition process. Conductive layer 232 can be one or more layers of Al, Cu, Sn, Ni, Au, Ag, or other suitable electrically conductive material. A portion of conductive layer 232 extends horizontally along insulating layer 230 and parallel to active surface 130 of semiconductor die 124 to laterally redistribute the electrical interconnect to conductive layer 212. Conductive layer 232 operates as a fan-out RDL for the electrical signals of semiconductor die 124. A portion of conductive layer 232 is electrically connected to conductive layer 212. Other portions of conductive layer 232 are electrically common or electrically isolated depending on the connectivity of semiconductor die 124.

Figure 9G:
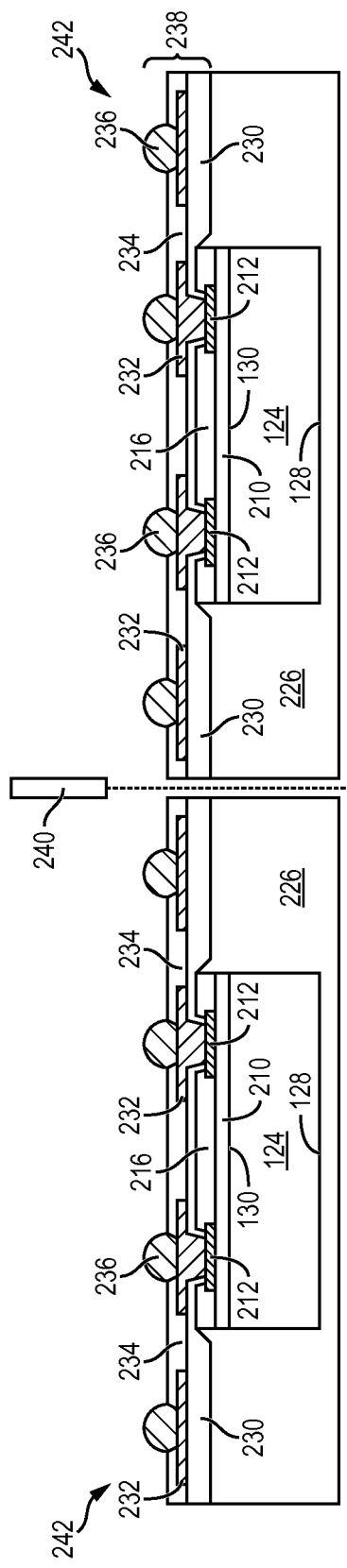

In FIG. 9g, an insulating or passivation layer 234 is formed over insulating layer 230 and conductive layer 232 using PVD, CVD, printing, spin coating, spray coating, screen printing or lamination. The insulating layer 234 can be one or more layers of SiO2, Si3N4, SiON, Ta2O5, Al2O3, polymer dielectric film, or other material having similar insulating and structural properties. A portion of insulating layer 234 is removed by an etching process with a patterned photoresist layer to expose conductive layer 232. Alternatively, a portion of insulating layer 234 is removed by LDA to expose conductive layer 232.

An electrically conductive bump material is deposited over the exposed conductive layer 232 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 232 using a suitable attachment or bonding process. In one embodiment, the bump material is reflowed by heating the material above its melting point to form balls or bumps 236. In some applications, bumps 236 are reflowed a second time to improve electrical contact to conductive layer 232. Bumps 236 can also be compression bonded to conductive layer 232. Bumps 236 represent one type of interconnect structure that can be formed over conductive layer 232. The interconnect structure can also use stud bump, micro bump, or other electrical interconnect.

The combination of insulating layers 230 and 234, conductive layer 232, and bumps 236 constitute a build-up interconnect structure 238 formed over semiconductor die 124 and encapsulant 226. Additional insulating layers and RDLs can be formed in build-up interconnect structure 238 for interconnection to semiconductor die 124. The reconstituted wafer 224 is singulated through encapsulant 226 and build-up interconnect structure 238 with saw blade or laser cutting tool 240 into individual Fo-WLCSP 242.

FIG. 10 shows Fo-WLCSP 242 after singulation. Semiconductor die 124 is electrically connected through build-up interconnect structure 238, including conductive layer 232 and bumps 236, to external devices. In one embodiment, insulating layers 210 and 216 are formed over semiconductor die 124 prior to singulation from wafer 120. The properties of insulating layers 210 and 216, i.e., high tensile strength greater than 100 MPa at room temperature, high elongation between 20-150% at room temperature, and a thickness of 2-30 μm, provides two layers of stress relief to reduce cracking, warpage, and other damage to the die during the formation of build-up interconnect structure 238, including insulating layers 230 and 234 and conductive layer 232.

FIG. 11 shows an embodiment with two side-by-side semiconductor die disposed within Fo-WLCSP 250. One semiconductor die 124a is formed in a manner described in FIGS. 3a-3f. Another semiconductor die 124b is formed in a manner described in FIGS. 9a-9b. The two side-by-side semiconductor die 124a-124b are covered by encapsulant 252, similar to FIGS. 4c and 9d. A build-up interconnect structure 254 is formed over semiconductor die 124a-124b, insulating layers 136 and 216, and encapsulant 252 in a manner similar to FIGS. 4e-4h and 9f-9g. The build-up interconnect structure 254 includes insulating layer 256, conductive layer 258, insulating layer 260, and bumps 262.

Figure 12A:
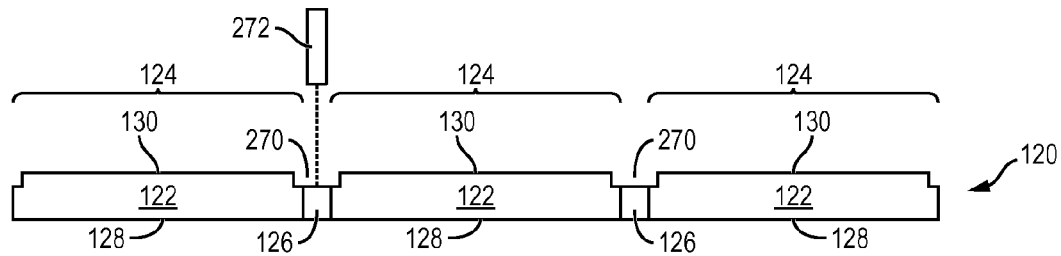
Figure 12B:
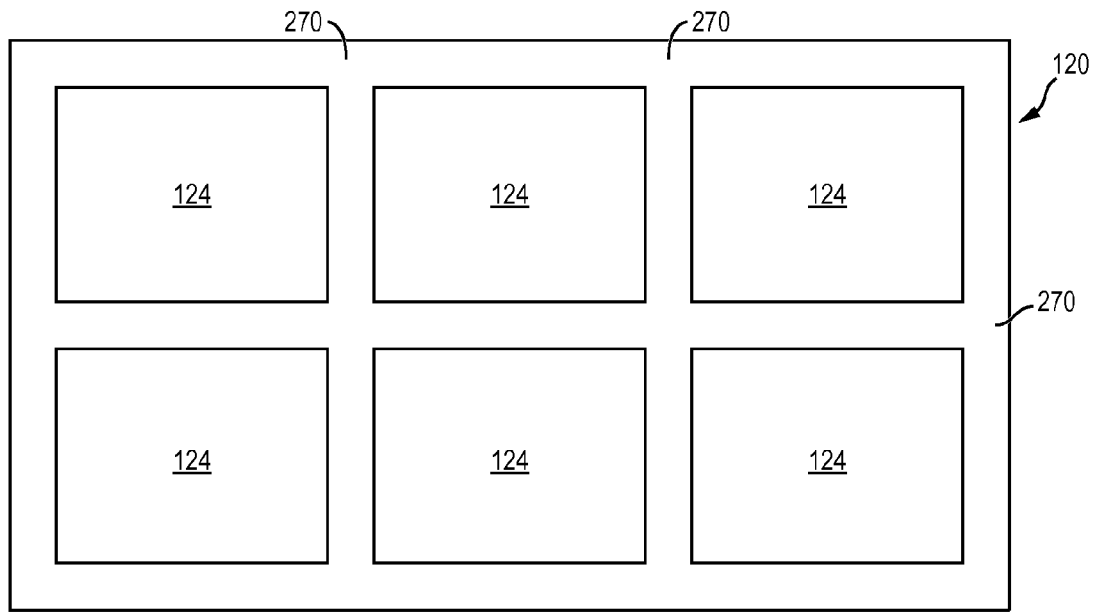

FIGS. 12a-12l illustrate, in relation to FIGS. 1 and 2a-2c, a process of forming a WLCSP with an insulating layer disposed over the semiconductor die and into a channel formed in the die for stress relief. Continuing from FIG. 3a, a plurality of channels or grooves 270 is formed in semiconductor wafer 120 into saw street 126 and extends partially into active surface 130 by LDA using laser 272, as shown in FIG. 12a. The width of channels 270 is greater than the width of saw street 126. In one embodiment, channels 270 have a depth of 5-20 μm and extend along one or more saw streets 126 or completely around the perimeter of semiconductor die 124. FIG. 12b shows a plan view of semiconductor wafer 120 with channels 270 formed completely around the perimeter of semiconductor die 124.

Figure 12C:
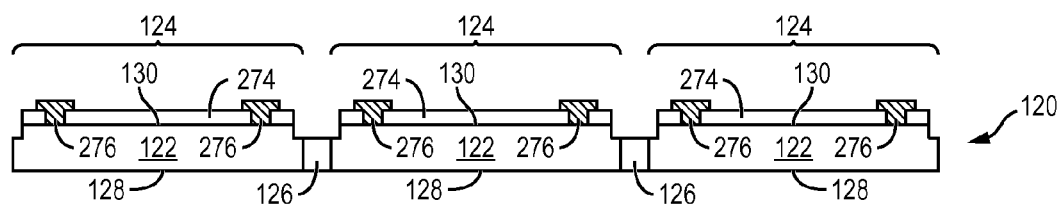

In FIG. 12c, an insulating or dielectric layer 274 is formed over active surface 130 using spin coating, spray coating, printing, lamination, PVD, CVD, sintering or thermal oxidation. The insulating layer 274 contains one or more layers of SiO2, Si3N4, SiON, Ta2O5, Al2O3, BCB, PI, PBO, polymer matrix dielectric film, organic polymer film, or other material having similar insulating and structural properties. In one embodiment, insulating layer 274 is Si3N4 or SiON. A portion of insulating layer 274 is removed by an etching process with a patterned photoresist layer to expose active surface 130.

An electrically conductive layer 276 is formed over insulating layer 274 and active surface 130 using PVD, CVD, electrolytic plating, electroless plating process, or other suitable metal deposition process. Conductive layer 276 can be one or more layers of Al, Cu, Sn, Ni, Au, Ag, or other suitable electrically conductive material. Conductive layer 276 operates as contact pads overlapping insulating layer 274 and electrically connected to the circuits on active surface 130.

Figure 12D:
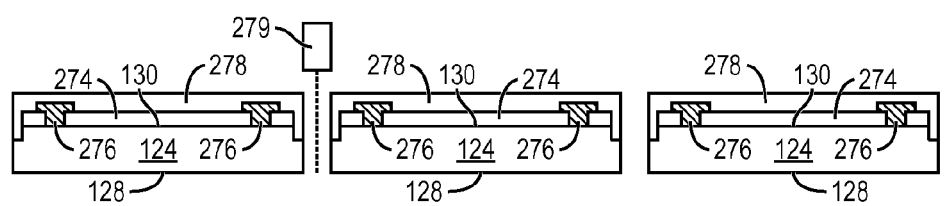

In FIG. 12d, an insulating or dielectric layer 278 is formed over insulating layer 274 and conductive layer 276 and into channels 270 using spin coating, spray coating, printing, lamination, PVD, CVD, sintering or thermal oxidation. In one embodiment, insulating layer 278 is applied as a blanket layer over insulating layer 274 and conductive layer 276. The insulating layer 278 contains one or more layers of SiO2, Si3N4, SiON, Ta2O5, Al2O3, BCB, PI, PBO, polymer matrix dielectric film, organic polymer film, or other material having similar insulating and structural properties. The insulating layer 278 is cured. The insulating layer 278 operates as a stress relief layer to reduce cracking, warpage, or other damage to active surface 130 and conductive layer 276 of semiconductor die 124 during later formation of the build-up interconnect structure. In particular, insulating layer 278 has properties of a high tensile strength greater than 100 MPa at room temperature, high elongation between 20-150%, at room temperature and a thickness of 2-30 μm. The insulating layer 278 extends into channels 270 to protect an edge of the sidewalls of semiconductor die 124 adjacent to active surface 130 by reducing cracking, warpage, or other damage during later formation of the build-up interconnect structure.

Semiconductor wafer 120 is singulated through saw street 126 using a cutting tool 279, such as a saw blade, water jet, or laser, into individual semiconductor die 124.

Figure 12E:
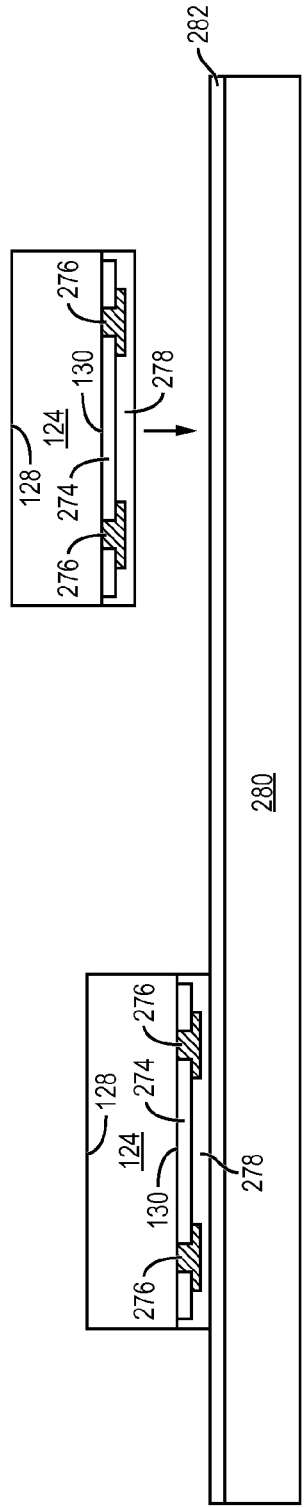
Figure 12F:
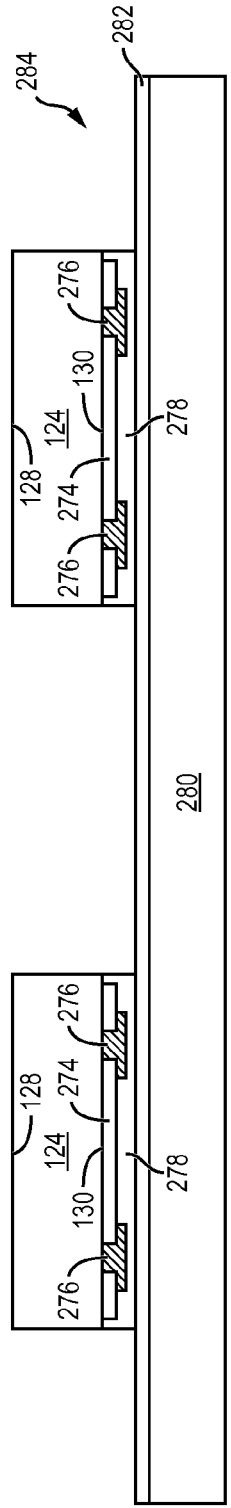

FIG. 12e shows a temporary substrate or carrier 280 containing sacrificial base material such as silicon, polymer, beryllium oxide, or other suitable low-cost, rigid material for structural support. An interface layer or double-sided tape 282 is formed over carrier 280 as a temporary adhesive bonding film or etch-stop layer. Semiconductor die 124 from FIGS. 12a-12d are positioned over and mounted to interface layer 282 and carrier 280 using a pick and place operation with active surface 130 oriented toward the carrier. FIG. 12f shows semiconductor die 124 mounted to carrier 280 to illustrate a portion of reconfigured or reconstituted wafer 284.

Figure 12G:
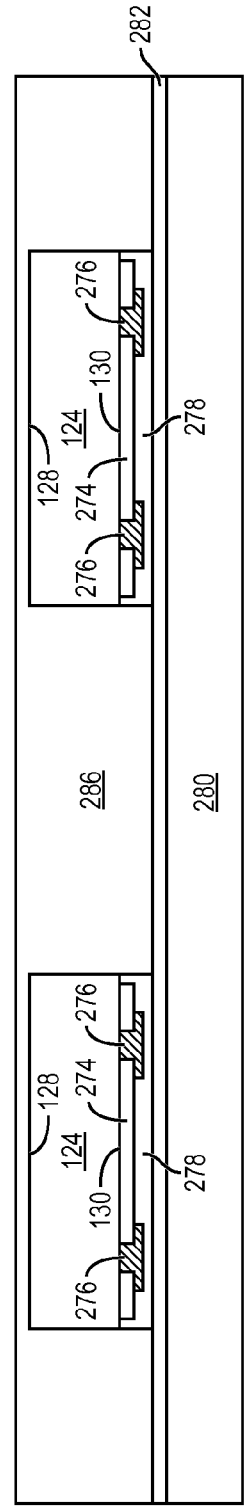

In FIG. 12g, an encapsulant or molding compound 286 is deposited over semiconductor die 124 and carrier 280 using a paste printing, compressive molding, transfer molding, liquid encapsulant molding, vacuum lamination, spin coating, or other suitable applicator. Encapsulant 286 can be polymer composite material, such as epoxy resin with filler, epoxy acrylate with filler, or polymer with proper filler. Encapsulant 286 is non-conductive and environmentally protects the semiconductor device from external elements and contaminants.

In FIG. 12h, carrier 280 and interface layer 282 are removed by chemical etching, mechanical peeling, CMP, mechanical grinding, thermal bake, UV light, laser scanning, or wet stripping to expose insulating layer 278 and encapsulant 286. Encapsulant 286 provides structural support for semiconductor die 124 after removal of carrier 280. A portion of insulating layer 278 is removed by an etching process with a patterned photoresist layer to expose conductive layer 276. The etching process also removes a portion of encapsulant 286 to a level below a surface of insulating layer 278. Alternatively, a portion of insulating layer 278 is removed by LDA using laser 288 to expose conductive layer 276. The insulating layer 278 remains overlapping conductive layer 276 after etching or LDA.

In FIG. 12i, an insulating or passivation layer 290 is formed over encapsulant 286, insulating layer 278, and conductive layer 276 using PVD, CVD, printing, spin coating, spray coating, screen printing or lamination. The insulating layer 290 contains one or more layers of SiO2, Si3N4, SiON, Ta2O5, Al2O3, polymer dielectric film, or other material having similar insulating and structural properties. A portion of insulating layer 290 is removed by an etching process with a patterned photoresist layer to expose conductive layer 276. Alternatively, a portion of insulating layer 290 is removed by LDA using laser 288 to expose conductive layer 276.

In FIG. 12j, an electrically conductive layer 292 is formed over insulating layer 290 and conductive layer 276 using patterning with PVD, CVD, sputtering, electrolytic plating, electroless plating process, or other suitable metal deposition process. Conductive layer 292 can be one or more layers of Al, Cu, Sn, Ni, Au, Ag, or other suitable electrically conductive material. A portion of conductive layer 292 extends horizontally along insulating layer 290 and parallel to active surface 130 of semiconductor die 124 to laterally redistribute the electrical interconnect to conductive layer 276. Conductive layer 292 operates as a fan-out RDL for the electrical signals of semiconductor die 124. A portion of conductive layer 292 is electrically connected to conductive layer 276. Other portions of conductive layer 292 are electrically common or electrically isolated depending on the connectivity of semiconductor die 124.

In FIG. 12k, an insulating or passivation layer 294 is formed over insulating layer 290 and conductive layer 292 using PVD, CVD, printing, spin coating, spray coating, screen printing or lamination. The insulating layer 294 can be one or more layers of SiO2, Si3N4, SiON, Ta2O5, Al2O3, polymer dielectric film, or other material having similar insulating and structural properties. A portion of insulating layer 294 is removed by an etching process with a patterned photoresist layer to expose conductive layer 292. Alternatively, a portion of insulating layer 294 is removed by LDA to expose conductive layer 292.

In FIG. 12l, an electrically conductive bump material is deposited over the exposed conductive layer 292 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 292 using a suitable attachment or bonding process. In one embodiment, the bump material is reflowed by heating the material above its melting point to form balls or bumps 296. In some applications, bumps 296 are reflowed a second time to improve electrical contact to conductive layer 292. Bumps 296 can also be compression bonded to conductive layer 292. Bumps 296 represent one type of interconnect structure that can be formed over conductive layer 292. The interconnect structure can also use stud bump, micro bump, or other electrical interconnect.

The combination of insulating layers 290 and 294, conductive layer 292, and bumps 296 constitute a build-up interconnect structure 298 formed over semiconductor die 124 and encapsulant 286. Additional insulating layers and RDLs can be formed in build-up interconnect structure 298 for interconnection to semiconductor die 124. The reconstituted wafer 284 is singulated through encapsulant 286 and build-up interconnect structure 298 with saw blade or laser cutting tool 300 into individual Fo-WLCSP 302.

FIG. 13 shows Fo-WLCSP 302 after singulation. Semiconductor die 124 is electrically connected through build-up interconnect structure 298, including conductive layer 292 and bumps 296, to external devices. In one embodiment, insulating layer 278 is formed over semiconductor die 124 prior to singulation from wafer 120. The properties of insulating layer 278, i.e., high tensile strength greater than 100 MPa at room temperature, high elongation between 20-150% at room temperature, and a thickness of 2-30 μm, provides stress relief to reduce cracking, warpage, and other damage to the die during the formation of build-up interconnect structure 298, including insulating layers 290 and 294 and conductive layer 292. In addition, insulating layer 278 extending into channels 270 protects an edge of the sidewalls of semiconductor die 124 adjacent to active surface 130 by reducing cracking, warpage, or other damage during formation of build-up interconnect structure 298.

Figure 14A:
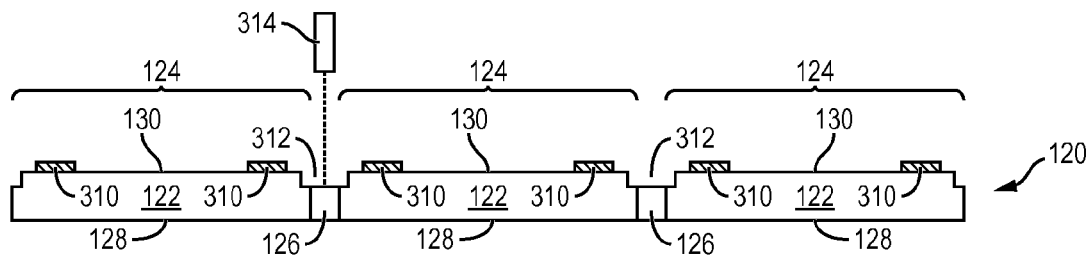
FIGS. 14a-14k illustrate another process of forming a WLCSP with an insulating layer disposed over the die and encapsulant and into a channel formed in the die.

FIGS. 14a-14k illustrate, in relation to FIGS. 1 and 2a-2c, another process of forming a WLCSP with an insulating layer disposed over the die and encapsulant and into a channel formed in the die. Continuing from FIG. 3a, an electrically conductive layer 310 is formed over active surface 130 using PVD, CVD, electrolytic plating, electroless plating process, or other suitable metal deposition process, as shown in FIG. 14a. Conductive layer 310 can be one or more layers of Al, Cu, Sn, Ni, Au, Ag, or other suitable electrically conductive material. Conductive layer 310 operates as contact pads electrically connected to the circuits on active surface 130. In this embodiment, conductive layer 310 has a high topology, e.g., greater than 0.6 μm.

Figure 14B:
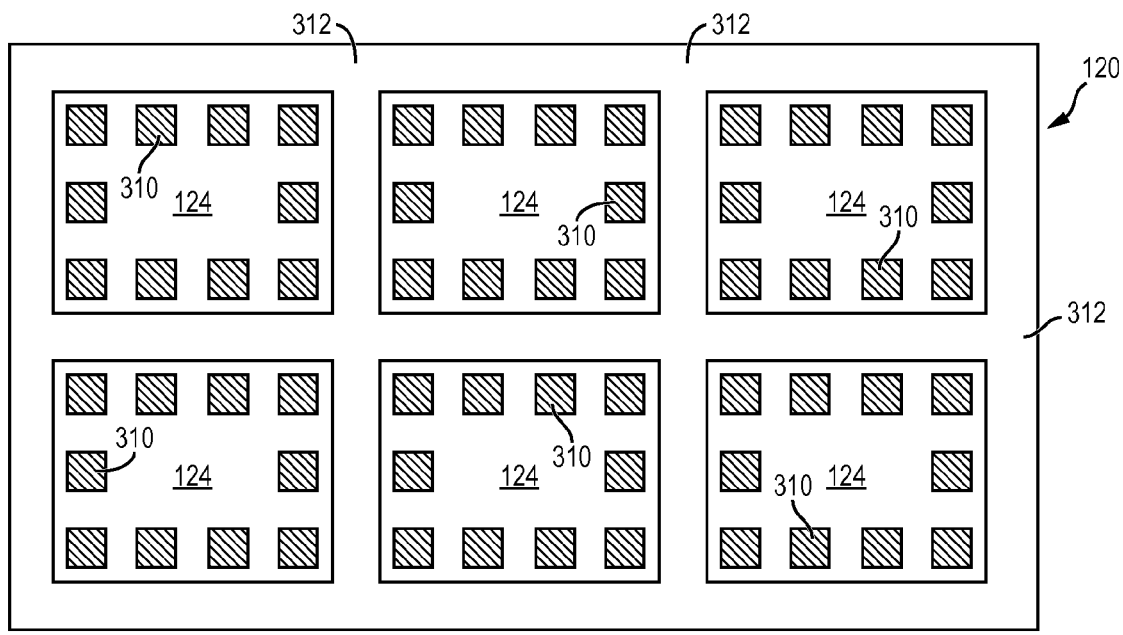

A plurality of channels or grooves 312 is formed in semiconductor wafer 120 into saw street 126 and extends partially into active surface 130 by LDA using laser 314. The width of channels 312 is greater than the width of saw street 126. In one embodiment, channels 312 have a depth of 5-20 μm and extend along one or more saw streets 126 or completely around the perimeter of semiconductor die 124. FIG. 14b shows a plan view of semiconductor wafer 120 with channels 312 formed completely around the perimeter of semiconductor die 124.

Figure 14C:
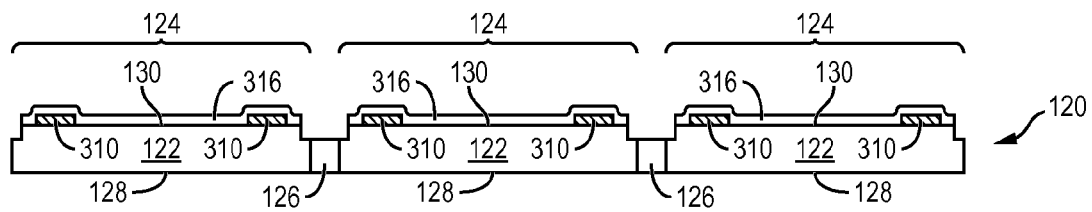

In FIG. 14c, an insulating or dielectric layer 316 is conformally applied over active surface 130 and conductive layer 312 using spin coating, spray coating, printing, lamination, PVD, CVD, sintering or thermal oxidation. The insulating layer 316 contains one or more layers of SiO2, Si3N4, SiON, Ta2O5, Al2O3, BCB, PI, PBO, polymer matrix dielectric film, organic polymer film, or other material having similar insulating and structural properties. The insulating layer 316 follows the contour of active surface 130 and conductive layer 312. The insulating layer 316 has a high topology to cover conductive layer 310.

Figure 14D:
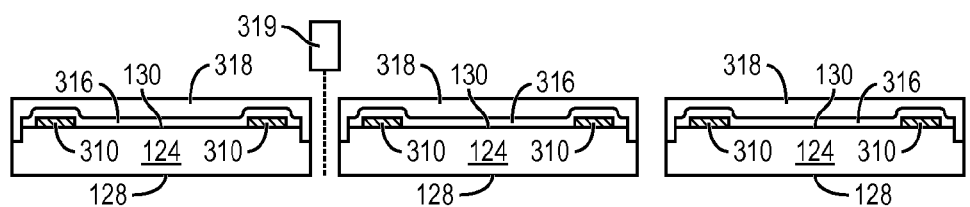

In FIG. 14d, a temporary planarization layer 318 is formed over insulating layer 316 and conductive layer 310 and into channels 312 using spin coating, spray coating, printing, lamination, PVD, CVD, sintering or thermal oxidation. In one embodiment, planarization layer 318 is applied as a blanket layer over the entire semiconductor wafer 120 without patterning. The planarization layer 318 contains one or more layers of SiO2, Si3N4, SiON, Ta2O5, Al2O3, BCB, PI, PBO, polymer matrix dielectric film, organic polymer film, or other material having similar insulating and structural properties. The temporary planarization layer 318 extends into channels 312.

Semiconductor wafer 120 is singulated through saw street 126 using a cutting tool 319, such as a saw blade, water jet, or laser, into individual semiconductor die 124.

Figure 14E:
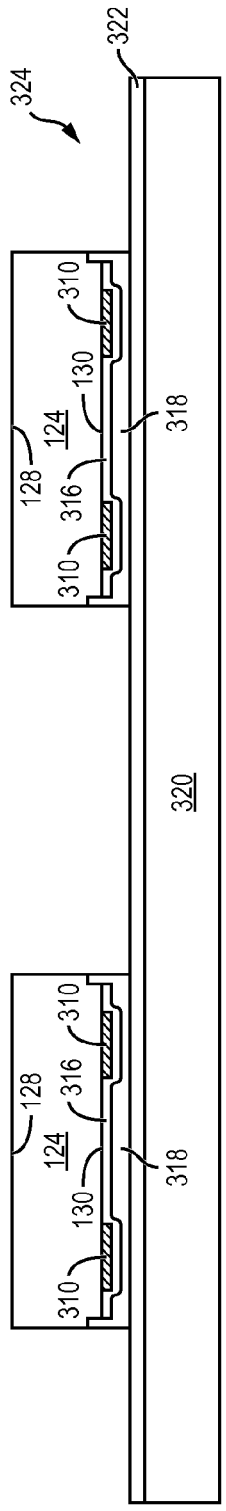

FIG. 14e shows a temporary substrate or carrier 320 containing sacrificial base material such as silicon, polymer, beryllium oxide, or other suitable low-cost, rigid material for structural support. An interface layer or double-sided tape 322 is formed over carrier 320 as a temporary adhesive bonding film or etch-stop layer. Semiconductor die 124 from FIGS. 14a-14d are positioned over and mounted to interface layer 322 and carrier 320 using a pick and place operation with active surface 130 oriented toward the carrier. Semiconductor die 124 mounted to carrier 320 constitute reconfigured wafer 324.

Figure 14F:
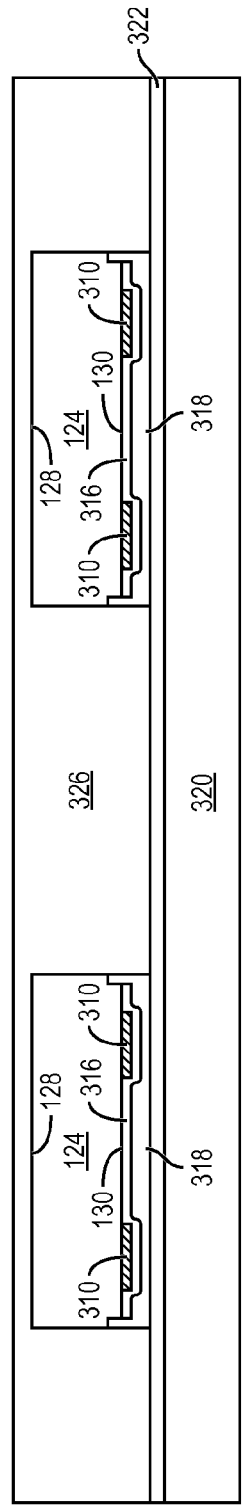

In FIG. 14f, an encapsulant or molding compound 326 is deposited over semiconductor die 124 and carrier 320 using a paste printing, compressive molding, transfer molding, liquid encapsulant molding, vacuum lamination, spin coating, or other suitable applicator. Encapsulant 326 can be polymer composite material, such as epoxy resin with filler, epoxy acrylate with filler, or polymer with proper filler. Encapsulant 326 is non-conductive and environmentally protects the semiconductor device from external elements and contaminants.

Figure 14G:
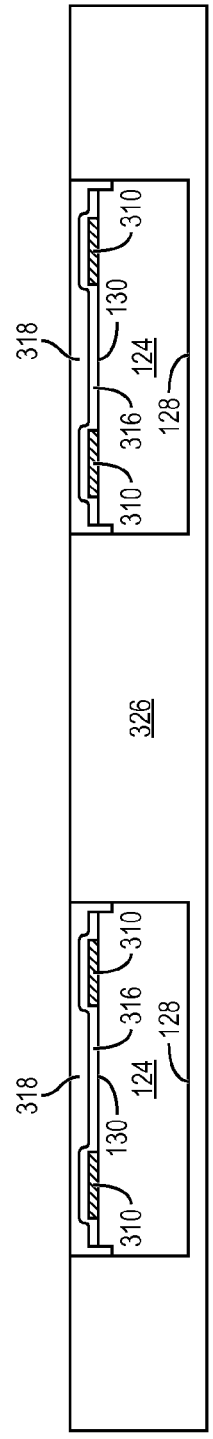

In FIG. 14g, carrier 320 and interface layer 322 are removed by chemical etching, mechanical peeling, CMP, mechanical grinding, thermal bake, UV light, laser scanning, or wet stripping to expose planarization layer 318 and encapsulant 326. Encapsulant 326 provides structural support for semiconductor die 124 after removal of carrier 320.

Figure 14H:
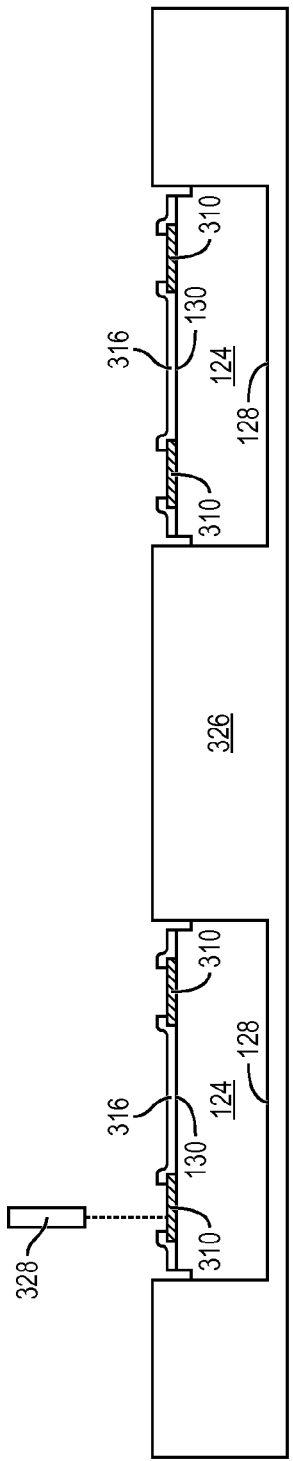

In FIG. 14h, the temporary planarization layer 318 is completely removed by wet chemical stripping process, or an etching process with a patterned photoresist layer, to expose insulating layer 316, conductive layer 310, and channels 312. A portion of insulating layer 316 is removed by an etching process with a patterned photoresist layer to expose conductive layer 310. Alternatively, a portion of insulating layer 316 is removed by LDA using laser 328 to expose conductive layer 310. The insulating layer 316 remains overlapping conductive layer 310 after etching or LDA.

Figure 14I:
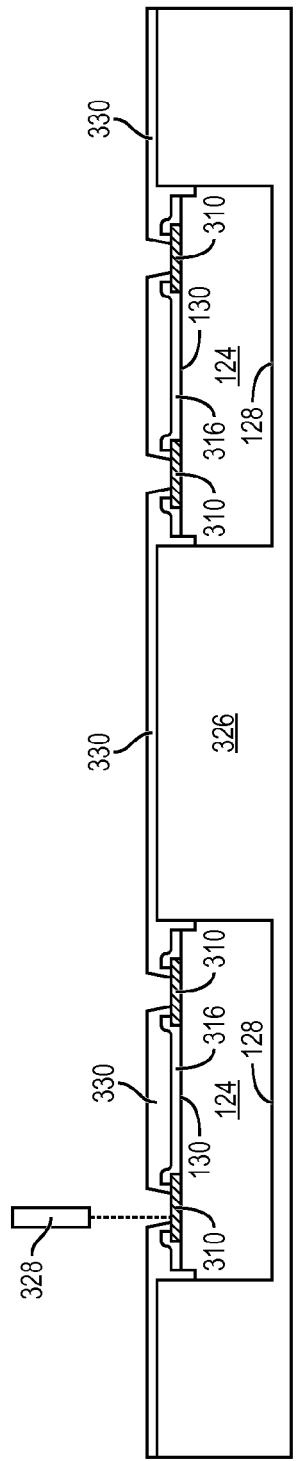

In FIG. 14i, an insulating or passivation layer 330 is formed over encapsulant 326 and insulating layer 316 and into channels 312 using PVD, CVD, printing, spin coating, spray coating, screen printing or lamination. The insulating layer 330 contains one or more layers of SiO2, Si3N4, SiON, Ta2O5, Al2O3, organic polymer, or other material having similar insulating and structural properties. The insulating layer 330 is cured. The insulating layer 330 operates as a stress relief layer to reduce cracking, warpage, or other damage to active surface 130 and conductive layer 310 of semiconductor die 124 during formation of the build-up interconnect structure. In particular, insulating layer 330 has properties of a high tensile strength greater than 100 MPa at room temperature, high elongation between 20-150% at room temperature, and a thickness of 5-30 µm over semiconductor die 124 and 2-35 µm over encapsulant 326. The insulating layer 330 extends into channels 312 to protect an edge of the sidewalls of semiconductor die 124 adjacent to active surface 130 by reducing cracking, warpage, or other damage during formation of the build-up interconnect structure. A portion of insulating layer 330 is removed by an etching process with a patterned photoresist layer to expose conductive layer 310. Alternatively, a portion of insulating layer 330 is removed by LDA using laser 328 to expose conductive layer 310.

Figure 14J:
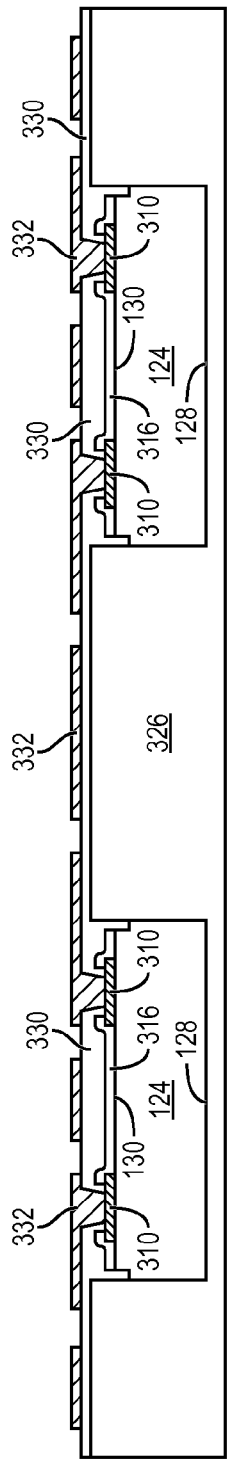

In FIG. 14j, an electrically conductive layer 332 is formed over insulating layer 330 and conductive layer 310 using patterning with PVD, CVD, sputtering, electrolytic plating, electroless plating process, or other suitable metal deposition process. Conductive layer 332 can be one or more layers of Al, Cu, Sn, Ni, Au, Ag, or other suitable electrically conductive material. A portion of conductive layer 332 extends horizontally along insulating layer 330 and parallel to active surface 130 of semiconductor die 124 to laterally redistribute the electrical interconnect to conductive layer 310. Conductive layer 332 operates as a fan-out RDL for the electrical signals of semiconductor die 124. A portion of conductive layer 332 is electrically connected to conductive layer 310. Other portions of conductive layer 332 are electrically common or electrically isolated depending on the connectivity of semiconductor die 124.

Figure 14K:
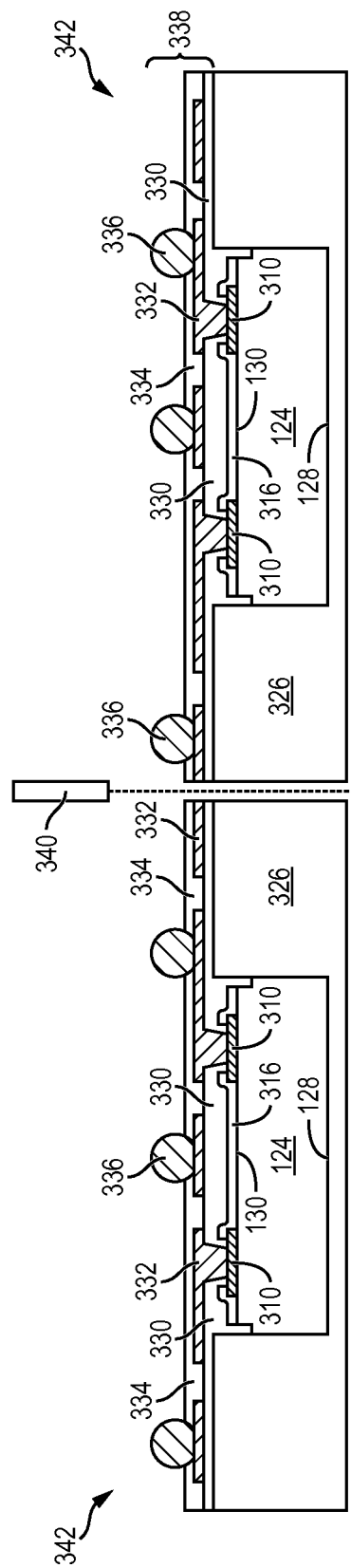

In FIG. 14k, an insulating or passivation layer 334 is formed over insulating layer 330 and conductive layer 332 using PVD, CVD, printing, spin coating, spray coating, screen printing or lamination. The insulating layer 334 can be one or more layers of SiO2, Si3N4, SiON, Ta2O5, Al2O3, polymer dielectric film, or other material having similar insulating and structural properties. A portion of insulating layer 334 is removed by an etching process with a patterned photoresist layer to expose conductive layer 332. Alternatively, a portion of insulating layer 334 is removed by LDA to expose conductive layer 332.

An electrically conductive bump material is deposited over the exposed conductive layer 332 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 332 using a suitable attachment or bonding process. In one embodiment, the bump material is reflowed by heating the material above its melting point to form balls or bumps 336. In some applications, bumps 336 are reflowed a second time to improve electrical contact to conductive layer 332. Bumps 336 can also be compression bonded to conductive layer 332. Bumps 336 represent one type of interconnect structure that can be formed over conductive layer 332. The interconnect structure can also use stud bump, micro bump, or other electrical interconnect.

The combination of insulating layers 330 and 334, conductive layer 332, and bumps 336 constitutes a build-up interconnect structure 338 formed over semiconductor die 124 and encapsulant 326. Additional insulating layers and RDLs can be formed in build-up interconnect structure 338 for interconnection to semiconductor die 124. The reconstituted wafer 324 is singulated through encapsulant 326 and build-up interconnect structure 338 with saw blade or laser cutting tool 340 into individual Fo-WLCSP 342.

Figure 15:
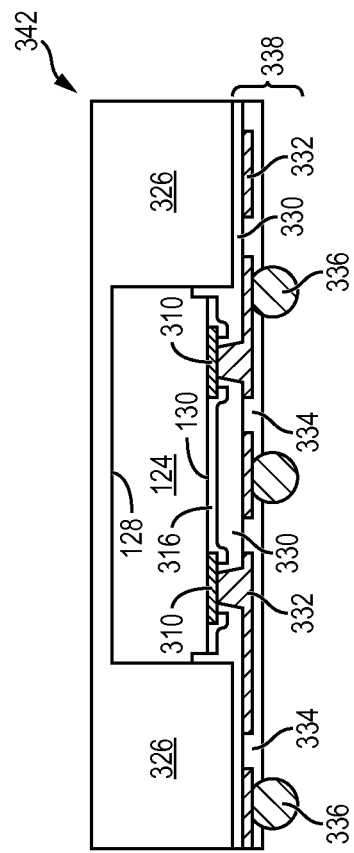
FIG. 15 illustrates the Fo-WLCSP according to FIGS. 14a-14k with an insulating layer disposed over the die and encapsulant and into a channel formed in the die.

FIG. 15 shows Fo-WLCSP 342 after singulation. Semiconductor die 124 is electrically connected through build-up interconnect structure 338, including conductive layer 332 and bumps 336, to external devices. The properties of insulating layer 330, i.e., high tensile strength greater than 100 MPa at room temperature, high elongation between 20-150% at room temperature, and a thickness of 2-30 μm, provides stress relief to reduce cracking, warpage, and other damage to the die during the formation of build-up interconnect structure 338, including insulating layer 334 and conductive layer 332. In addition, insulating layer 330 extending into channels 312 protects an edge of the sidewalls of semiconductor die 124 adjacent to active surface 130 by reducing cracking or other damage during formation of build-up interconnect structure 338. The insulating material 330 in channels 312 also reduces warpage during formation of build-up interconnect structure 338.

Figure 16A:
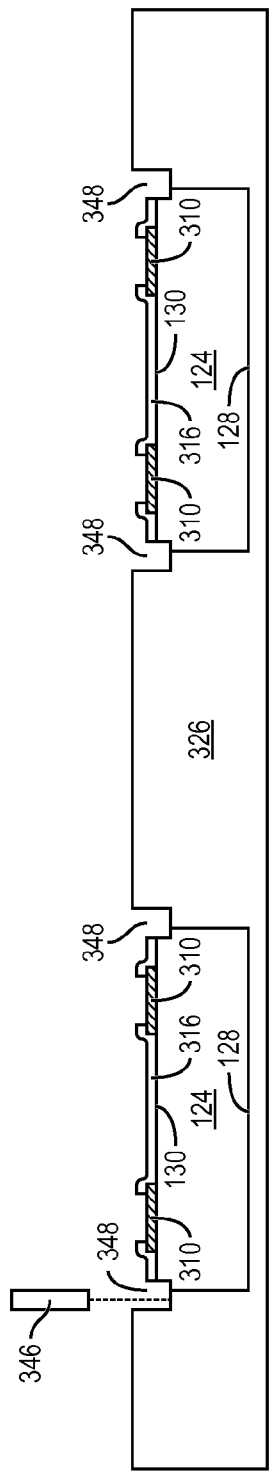
FIGS. 16a-16d illustrate a process of forming a WLCSP with an insulating layer disposed over the die and encapsulant and into channels formed in the die and encapsulant.

FIGS. 16a-16d illustrate, in relation to FIGS. 1 and 2a-2c, a process of forming a WLCSP with an insulating layer disposed over the die and encapsulant and into channels formed in the die and encapsulant for stress relief. Continuing from FIG. 14h, a portion of encapsulant 326 is removed by LDA using laser 346 to form channels 348 in the encapsulant adjacent to channels 312, as shown in FIG. 16a. Channels 348 extend along one or more sides of semiconductor die 124 or completely around the perimeter of the die.

Figure 16B:
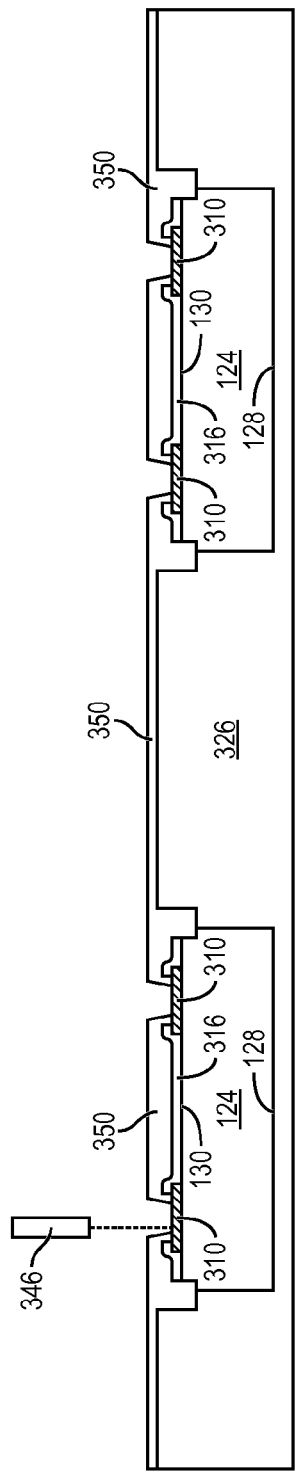

In FIG. 16b, an insulating or passivation layer 350 is formed over encapsulant 326 and insulating layer 316 and into channels 312 using PVD, CVD, printing, spin coating, spray coating, screen printing or lamination. The insulating layer 350 contains one or more layers of SiO2, Si3N4, SiON, Ta2O5, Al2O3, organic polymer, or other material having similar insulating and structural properties. The insulating layer 350 is cured. The insulating layer 350 operates as a stress relief layer to reduce cracking, warpage, or other damage to active surface 130 and conductive layer 310 of semiconductor die 124 during formation of the build-up interconnect structure. In particular, insulating layer 350 has properties of a high tensile strength greater than 100 MPa at room temperature, high elongation between 20-150% at room temperature, and a thickness of 2-30 μm over encapsulant 326. The insulating layer 350 extends into channels 312 and 348 to protect an edge of the sidewalls of semiconductor die 124 adjacent to active surface 130 by reducing cracking, warpage, or other damage during formation of the build-up interconnect structure. A portion of insulating layer 350 is removed by an etching process with a patterned photoresist layer to expose conductive layer 310. Alternatively, a portion of insulating layer 350 is removed by LDA using laser 346 to expose conductive layer 310.

Figure 16C:
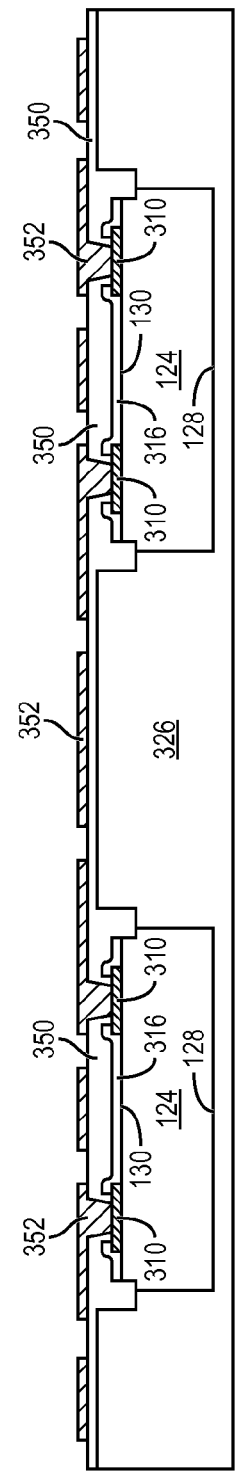

In FIG. 16c, an electrically conductive layer 352 is formed over insulating layer 350 and conductive layer 310 using patterning with PVD, CVD, sputtering, electrolytic plating, electroless plating process, or other suitable metal deposition process. Conductive layer 352 can be one or more layers of Al, Cu, Sn, Ni, Au, Ag, or other suitable electrically conductive material. A portion of conductive layer 352 extends horizontally along insulating layer 350 and parallel to active surface 130 of semiconductor die 124 to laterally redistribute the electrical interconnect to conductive layer 310. Conductive layer 352 operates as a fan-out RDL for the electrical signals of semiconductor die 124. A portion of conductive layer 352 is electrically connected to conductive layer 310. Other portions of conductive layer 352 are electrically common or electrically isolated depending on the connectivity of semiconductor die 124.

Figure 16D:
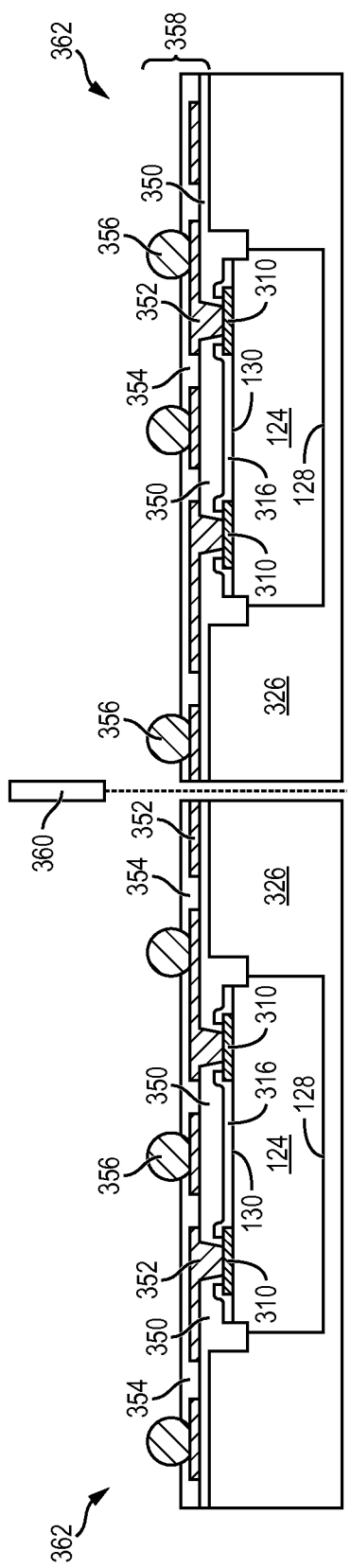

In FIG. 16d, an insulating or passivation layer 354 is formed over insulating layer 350 and conductive layer 352 using PVD, CVD, printing, spin coating, spray coating, screen printing or lamination. The insulating layer 354 can be one or more layers of SiO2, Si3N4, SiON, Ta2O5, Al2O3, polymer dielectric film, or other material having similar insulating and structural properties. A portion of insulating layer 354 is removed by an etching process with a patterned photoresist layer to expose conductive layer 352. Alternatively, a portion of insulating layer 354 is removed by LDA to expose conductive layer 352.

An electrically conductive bump material is deposited over the exposed conductive layer 352 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 352 using a suitable attachment or bonding process. In one embodiment, the bump material is reflowed by heating the material above its melting point to form balls or bumps 356. In some applications, bumps 356 are reflowed a second time to improve electrical contact to conductive layer 352. Bumps 356 can also be compression bonded to conductive layer 352. Bumps 356 represent one type of interconnect structure that can be formed over conductive layer 352. The interconnect structure can also use stud bump, micro bump, or other electrical interconnect.

The combination of insulating layers 350 and 354, conductive layer 352, and bumps 356 constitute a build-up interconnect structure 358 formed over semiconductor die 124 and encapsulant 326. Additional insulating layers and RDLs can be formed in build-up interconnect structure 358 for interconnection to semiconductor die 124. The reconstituted wafer 324 is singulated through encapsulant 326 and build-up interconnect structure 358 with saw blade or laser cutting tool 360 into individual Fo-WLCSP 362.

Figure 17:
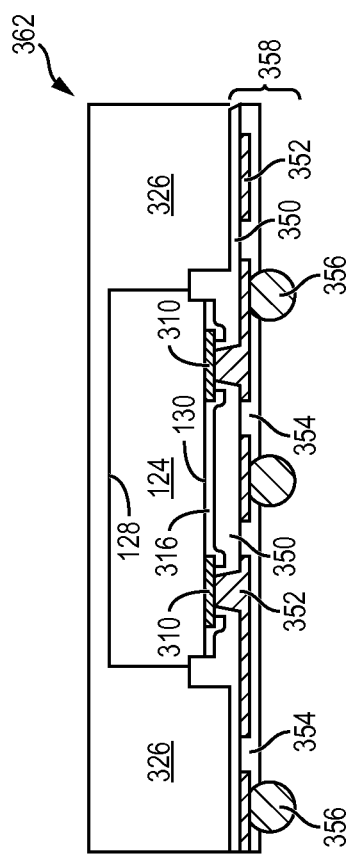
FIG. 17 illustrates the Fo-WLCSP according to FIGS. 16a-16d with an insulating layer disposed over the semiconductor die and encapsulant and into a channel formed in the die.

FIG. 17 shows Fo-WLCSP 362 after singulation. Semiconductor die 124 is electrically connected through build-up interconnect structure 358, including conductive layer 352 and bumps 356, to external devices. The properties of insulating layer 350, i.e., high tensile strength greater than 100 MPa at room temperature, high elongation between 20-150% at room temperature, and a thickness of 2-30 μm, provides stress relief to reduce cracking, warpage, and other damage to the die during the formation of build-up interconnect structure 358, including insulating layer 354 and conductive layer 352. In addition, insulating layer 350 extending into channels 312 and 348 protects an edge of the sidewalls of semiconductor die 124 adjacent to active surface 130 by reducing cracking or other damage during formation of build-up interconnect structure 358. The insulating material 350 in channels 312 and 348 also reduces warpage during formation of build-up interconnect structure 358.

Figure 18A:
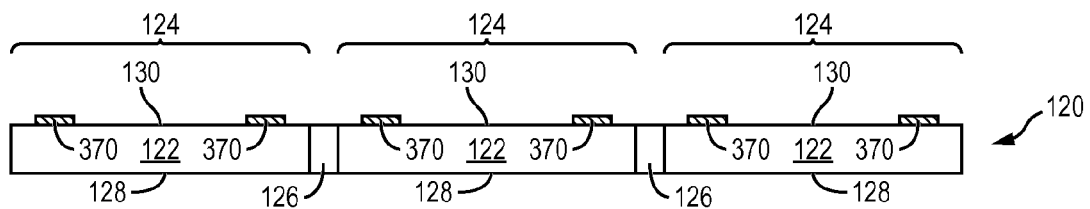

FIGS. 18a-18j illustrate, in relation to FIGS. 1 and 2a-2c, a process of forming a WLCSP with an insulating layer disposed over the die and encapsulant and into a channel formed in the encapsulant for stress relief. Continuing from FIG. 3a, an electrically conductive layer 370 is formed over active surface 130 using PVD, CVD, electrolytic plating, electroless plating process, or other suitable metal deposition process, as shown in FIG. 18a. Conductive layer 370 can be one or more layers of Al, Cu, Sn, Ni, Au, Ag, or other suitable electrically conductive material. Conductive layer 370 operates as contact pads electrically connected to the circuits on active surface 130.

Figure 18B:
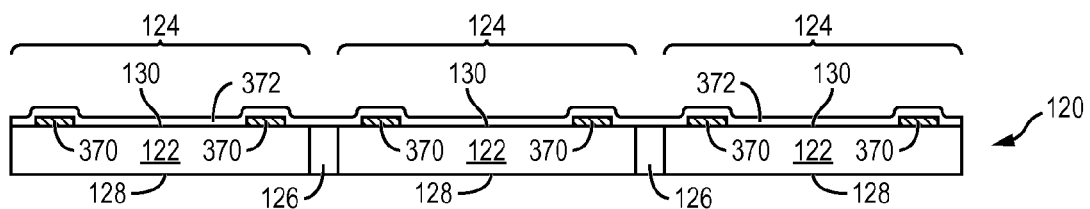

In FIG. 18b, an insulating or dielectric layer 372 is conformally applied over active surface 130 and conductive layer 370 using spin coating, spray coating, printing, lamination, PVD, CVD, sintering or thermal oxidation. The insulating layer 372 contains one or more layers of SiO2, Si3N4, SiON, Ta2O5, Al2O3, BCB, PI, PBO, polymer matrix dielectric film, organic polymer film, or other material having similar insulating and structural properties. The insulating layer 372 follows the contour of active surface 130 and conductive layer 370.

Figure 18C:
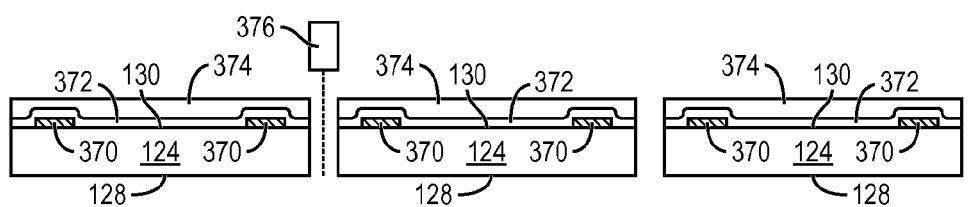

In FIG. 18c, a temporary planarization layer 374 is formed over insulating layer 372 and conductive layer 370 using spin coating, spray coating, printing, lamination, PVD, CVD, sintering or thermal oxidation. In one embodiment, planarization layer 374 is applied as a blanket layer over the entire semiconductor wafer 120 without patterning. The planarization layer 374 contains one or more layers of SiO2, Si3N4, SiON, Ta2O5, Al2O3, BCB, PI, PBO, polymer matrix dielectric film, organic polymer film, or other material having similar insulating and structural properties.

Semiconductor wafer 120 is singulated through saw street 126 using a cutting tool 376, such as a saw blade, water jet, or laser, into individual semiconductor die 124.

FIG. 18d shows a temporary substrate or carrier 380 containing sacrificial base material such as silicon, polymer, beryllium oxide, or other suitable low-cost, rigid material for structural support. An interface layer or double-sided tape 382 is formed over carrier 380 as a temporary adhesive bonding film or etch-stop layer. Semiconductor die 124 from FIGS. 18a-18c are positioned over and mounted to interface layer 382 and carrier 380 using a pick and place operation with active surface 130 oriented toward the carrier. Semiconductor die 124 mounted to carrier 380 constitute reconfigured wafer 384.

In FIG. 18e, an encapsulant or molding compound 386 is deposited over semiconductor die 124 and carrier 380 using a paste printing, compressive molding, transfer molding, liquid encapsulant molding, vacuum lamination, spin coating, or other suitable applicator. Encapsulant 386 can be polymer composite material, such as epoxy resin with filler, epoxy acrylate with filler, or polymer with proper filler. Encapsulant 386 is non-conductive and environmentally protects the semiconductor device from external elements and contaminants.

In FIG. 18f, carrier 380 and interface layer 382 are removed by chemical etching, mechanical peeling, CMP, mechanical grinding, thermal bake, UV light, laser scanning, or wet stripping to expose planarization layer 374 and encapsulant 386. Encapsulant 386 provides structural support for semiconductor die 124 after removal of carrier 380.

In FIG. 18g, the temporary planarization layer 374 is completely removed by wet chemical stripping process, or an etching process with a patterned photoresist layer, to expose insulating layer 372 and conductive layer 370. A portion of encapsulant 386 is removed by LDA using laser 387 to form channels 388 in the encapsulant adjacent to insulating layer 372. Channels 388 extend along one or more sides of semiconductor die 124 or completely around the perimeter of the die. In addition, a portion of insulating layer 372 is removed by an etching process with a patterned photoresist layer to expose conductive layer 370. Alternatively, a portion of insulating layer 372 is removed by LDA using laser 387 to expose conductive layer 370. The insulating layer 372 remains overlapping conductive layer 370 after etching or LDA.

In FIG. 18h, an insulating or passivation layer 390 is formed over encapsulant 386, insulating layer 372, conductive layer 370, and into channels 388 using PVD, CVD, printing, spin coating, spray coating, screen printing or lamination. The insulating layer 390 contains one or more layers of SiO2, Si3N4, SiON, Ta2O5, Al2O3, organic polymer, or other material having similar insulating and structural properties. The insulating layer 390 is cured. The insulating layer 390 operates as a stress relief layer to reduce cracking, warpage, or other damage to active surface 130 and conductive layer 372 of semiconductor die 124 during formation of the build-up interconnect structure. In particular, insulating layer 390 has properties of a high tensile strength greater than 100 MPa at room temperature, high elongation between 20-150% at room temperature, and a thickness of 2-30 μm over semiconductor die 124 and 2-35 μm over encapsulant 386. The insulating layer 390 extends into channels 388 to protect an edge of the sidewalls of semiconductor die 124 adjacent to active surface 130 by reducing cracking, warpage, or other damage during formation of the build-up interconnect structure. A portion of insulating layer 390 is removed by an etching process with a patterned photoresist layer to expose conductive layer 370. Alternatively, a portion of insulating layer 390 is removed by LDA using laser 387 to expose conductive layer 370.

In FIG. 18i, an electrically conductive layer 392 is formed over insulating layer 390 and conductive layer 370 using patterning with PVD, CVD, sputtering, electrolytic plating, electroless plating process, or other suitable metal deposition process. Conductive layer 392 can be one or more layers of Al, Cu, Sn, Ni, Au, Ag, or other suitable electrically conductive material. A portion of conductive layer 392 extends horizontally along insulating layer 390 and parallel to active surface 130 of semiconductor die 124 to laterally redistribute the electrical interconnect to conductive layer 370. Conductive layer 392 operates as a fan-out RDL for the electrical signals of semiconductor die 124. A portion of conductive layer 392 is electrically connected to conductive layer 370. Other portions of conductive layer 392 are electrically common or electrically isolated depending on the connectivity of semiconductor die 124.

Figure 18J:
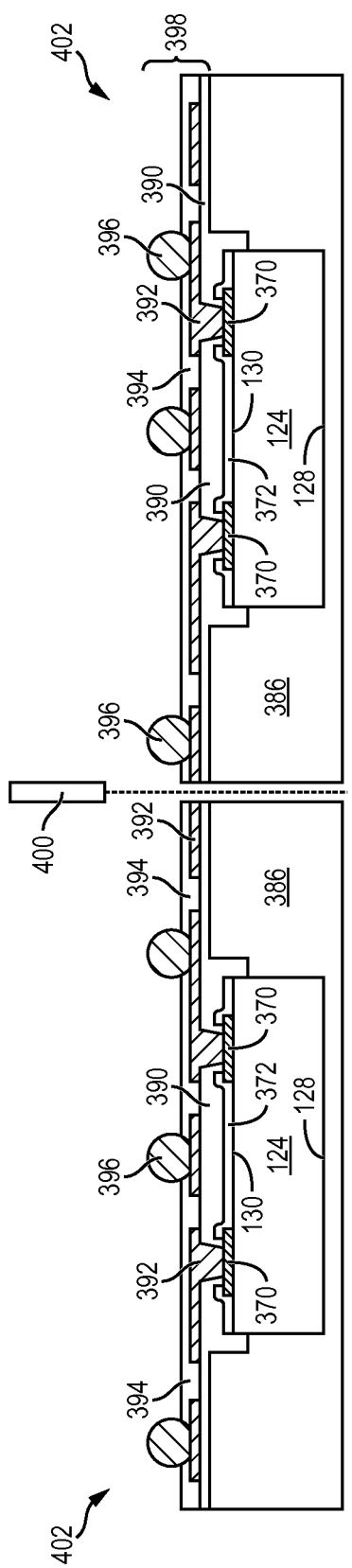

In FIG. 18j, an insulating or passivation layer 394 is formed over insulating layer 390 and conductive layer 392 using PVD, CVD, printing, spin coating, spray coating, screen printing or lamination. The insulating layer 394 can be one or more layers of SiO2, Si3N4, SiON, Ta2O5, Al2O3, polymer dielectric film, or other material having similar insulating and structural properties. A portion of insulating layer 394 is removed by an etching process with a patterned photoresist layer to expose conductive layer 392. Alternatively, a portion of insulating layer 394 is removed by LDA to expose conductive layer 392.

An electrically conductive bump material is deposited over the exposed conductive layer 392 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 392 using a suitable attachment or bonding process. In one embodiment, the bump material is reflowed by heating the material above its melting point to form balls or bumps 396. In some applications, bumps 396 are reflowed a second time to improve electrical contact to conductive layer 392. Bumps 396 can also be compression bonded to conductive layer 392. Bumps 396 represent one type of interconnect structure that can be formed over conductive layer 392. The interconnect structure can also use stud bump, micro bump, or other electrical interconnect.

The combination of insulating layers 390 and 394, conductive layer 392, and bumps 396 constitute a build-up interconnect structure 398 formed over semiconductor die 124 and encapsulant 386. Additional insulating layers and RDLs can be formed in build-up interconnect structure 398 for interconnection to semiconductor die 124. The reconstituted wafer 384 is singulated through encapsulant 386 and build-up interconnect structure 398 with saw blade or laser cutting tool 400 into individual Fo-WLCSP 402.

Figure 19:
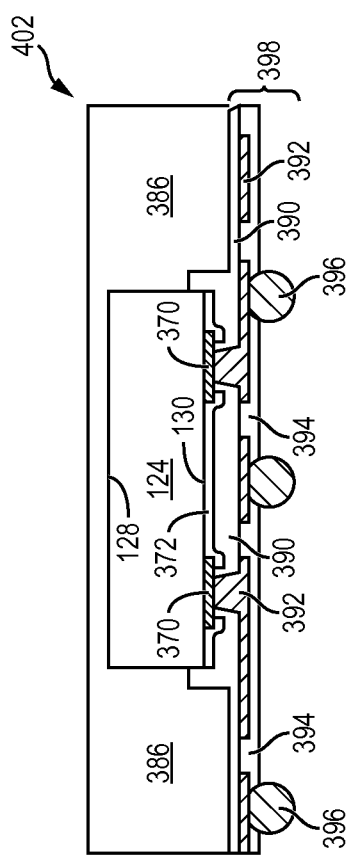
FIG. 19 illustrates the Fo-WLCSP according to FIGS. 18a-18j with an insulating layer disposed over the die and encapsulant and into a channel formed in the encapsulant.

FIG. 19 shows Fo-WLCSP 402 after singulation. Semiconductor die 124 is electrically connected through build-up interconnect structure 398, including conductive layer 392 and bumps 396, to external devices. The properties of insulating layer 390, i.e., high tensile strength greater than 100 MPa at room temperature, high elongation between 20-150% at room temperature, and a thickness of 2-30 μm, provides stress relief to reduce cracking, warpage, and other damage to the die during the formation of build-up interconnect structure 398, including insulating layer 394 and conductive layer 392. In addition, insulating layer 390 extending into channels 388 protects an edge of the sidewalls of semiconductor die 124 adjacent to insulating layer 372 by reducing cracking or other damage during formation of build-up interconnect structure 398. The insulating material 390 in channels 388 also reduces warpage during formation of build-up interconnect structure 398.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor die;
   forming a first stress relief layer over the semiconductor die;
   depositing an encapsulant over the semiconductor die and first stress relief layer; and
   forming an interconnect structure over the first stress relief layer.

2. The method of claim 1, further including forming a second stress relief layer over the first stress relief layer.

3. The method of claim 1, further including forming a first insulating layer over the semiconductor die.

4. The method of claim 3, further including forming a conductive layer over the first insulating layer.

5. The method of claim 1, further including:
   forming a channel in the semiconductor die; and
   forming the first stress relief layer in the channel.

6. The method of claim 1, further including removing a portion of the stress relief layer by laser direct ablation.

7. A method of making a semiconductor device, comprising:
   providing a semiconductor die;
   depositing an encapsulant over the semiconductor die;
   forming a first insulating layer over the semiconductor die; and
   forming an interconnect structure over the first insulating layer and encapsulant.

8. The method of claim 7, further including forming a second insulating layer over the semiconductor die.

9. The method of claim 8, wherein the first insulating layer or second insulating layer provides stress relief.

10. The method of claim 7, further including forming the first insulating layer over the encapsulant.

11. The method of claim 7, further including removing a portion of the first insulating layer by laser direct ablation.

12. The method of claim 7, further including:
    forming a planarization layer over the semiconductor die; and
    removing the planarization layer after depositing the encapsulant.

13. The method of claim 7, further including:
    forming a channel in the encapsulant; and
    forming the first insulating layer in the channel.

14. A semiconductor device, comprising:
    a first semiconductor die;
    a first insulating layer formed over the first semiconductor die;
    a second insulating layer formed over the first insulating layer; and
    an encapsulant deposited over the first semiconductor die and first and second insulating layers.

15. The semiconductor device of claim 14, further including a conductive layer formed over the first and second insulating layers.

16. The semiconductor device of claim 15, wherein the second insulating layer provides stress relief.

17. The semiconductor device of claim 14, further including a second semiconductor die disposed side-by-side with the first semiconductor die.

18. The semiconductor device of claim 14, further including a channel formed in the first semiconductor die, wherein the first insulating layer is formed in the channel.

19. The semiconductor device of claim 14, wherein the first insulating layer includes a tensile strength of 100 MPa or greater.

20. A semiconductor device, comprising:
    a semiconductor die;
    a first insulating layer formed over the semiconductor die;
    an encapsulant deposited over the first insulating layer; and
    a first conductive layer formed over the first insulating layer.

21. The semiconductor device of claim 20, further including a second insulating layer formed over the semiconductor die.

22. The semiconductor device of claim 21, wherein the first insulating layer or second insulating layer provides stress relief.

23. The semiconductor device of claim 20, further including the first insulating layer formed over the encapsulant.

24. The semiconductor device of claim 20, further including a channel formed in the semiconductor die, wherein the first insulating layer is formed in the channel.

25. The semiconductor device of claim 20, further including a channel formed in the encapsulant, wherein the first insulating layer is formed in the channel.

* * * * *